(12) United States Patent
Sugimoto et al.

(10) Patent No.: US 7,323,724 B2
(45) Date of Patent: *Jan. 29, 2008

(54) NITRIDE SEMICONDUCTOR DEVICE

(75) Inventors: Yasunobu Sugimoto, Anan (JP);
Akinori Yoneda, Anan (JP)

(73) Assignee: Nichia Corporation, Anan-shi (JP)

( * ) Notice: Subject to any disclaimer, the term of this patent is extended or adjusted under 35 U.S.C. 154(b) by 60 days.

This patent is subject to a terminal disclaimer.

(21) Appl. No.: 11/311,242

(22) Filed: Dec. 20, 2005

(65) Prior Publication Data

US 2006/0091417 A1    May 4, 2006

Related U.S. Application Data

(63) Continuation of application No. 10/780,849, filed on Feb. 19, 2004, now Pat. No. 7,009,218.

(30) Foreign Application Priority Data

Feb. 19, 2003    (JP)    ............................ 2003-041060

(51) Int. Cl.
*H01L 33/00*    (2006.01)

(52) U.S. Cl. ............................ 257/99; 257/79; 257/95; 257/98; 257/E33.001

(58) Field of Classification Search ................. 257/79, 257/95, 98, 99
See application file for complete search history.

(56) References Cited

U.S. PATENT DOCUMENTS

| | | | |
|---|---|---|---|
| 5,889,295 A * | 3/1999 | Rennie et al. ................. 257/96 |
| 6,229,150 B1 * | 5/2001 | Takayama et al. ............ 257/12 |
| 6,610,995 B2 | 8/2003 | Nakamura et al. | |
| 6,649,941 B2 | 11/2003 | Uemura | |
| 7,009,218 B2 * | 3/2006 | Sugimoto et al. ............. 257/99 |
| 2003/0015721 A1 * | 1/2003 | Slater et al. ................... 257/99 |

FOREIGN PATENT DOCUMENTS

JP        2000-299528 A        10/2000

* cited by examiner

*Primary Examiner*—Wai-Sing Louie
(74) *Attorney, Agent, or Firm*—Smith Patent Office

(57) ABSTRACT

A nitride semiconductor device includes a semiconductor layer, a first electrode for establishing an ohmic contact disposed on the semiconductor layer, and a second electrode on the first electrode, having a different shape from that of the first electrode. A joint region is formed with the upper layer of the first electrode and the lower layer of the second electrode. The joint region comprises an element of the platinum group.

36 Claims, 8 Drawing Sheets

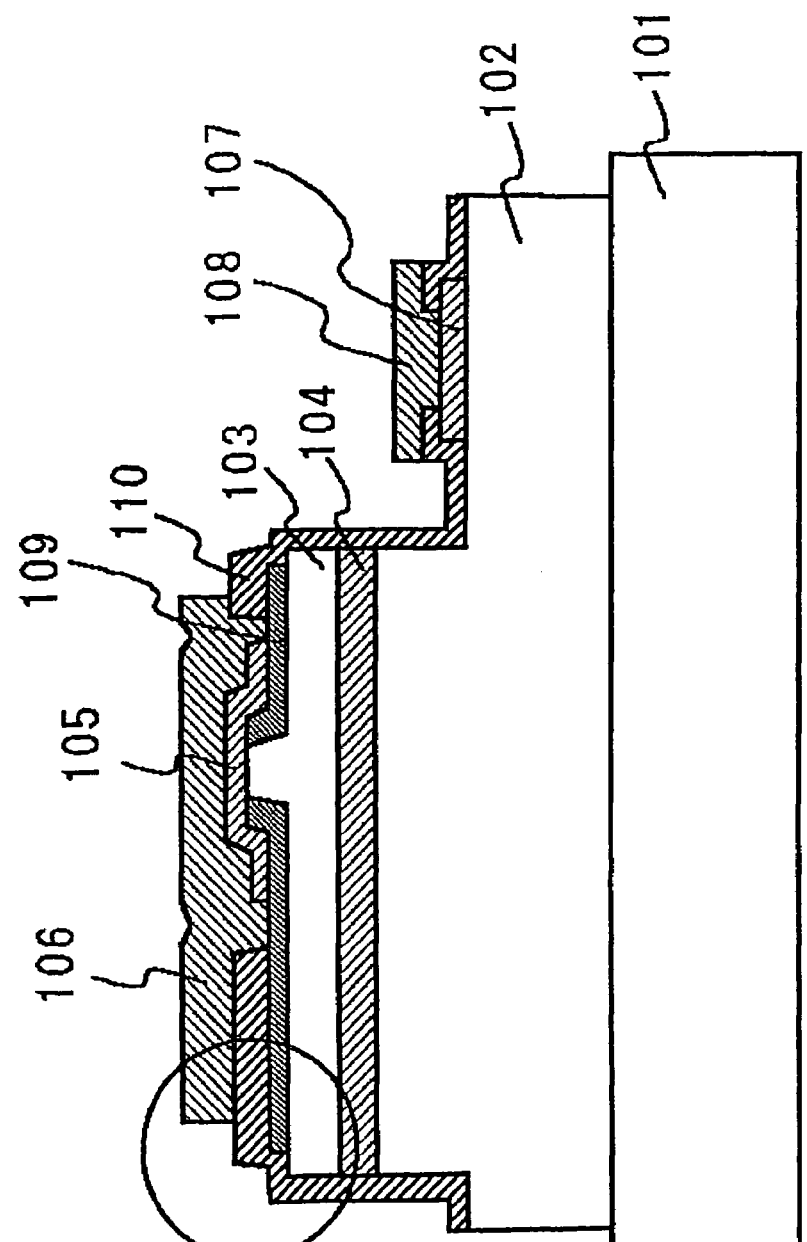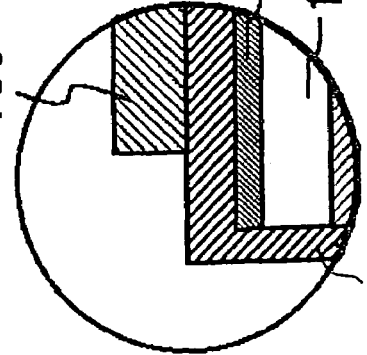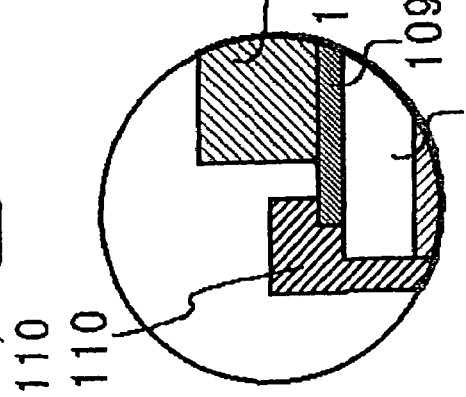

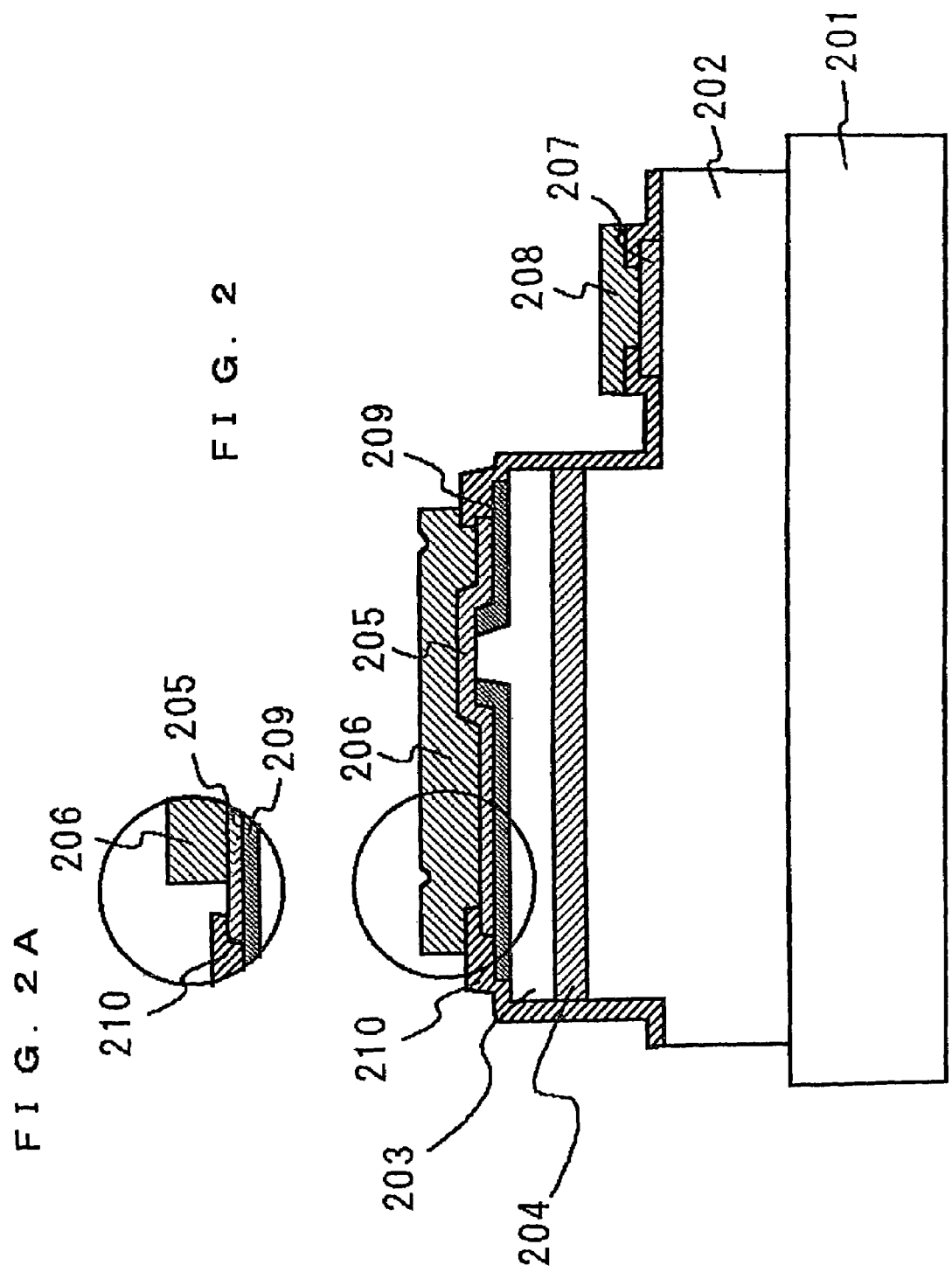

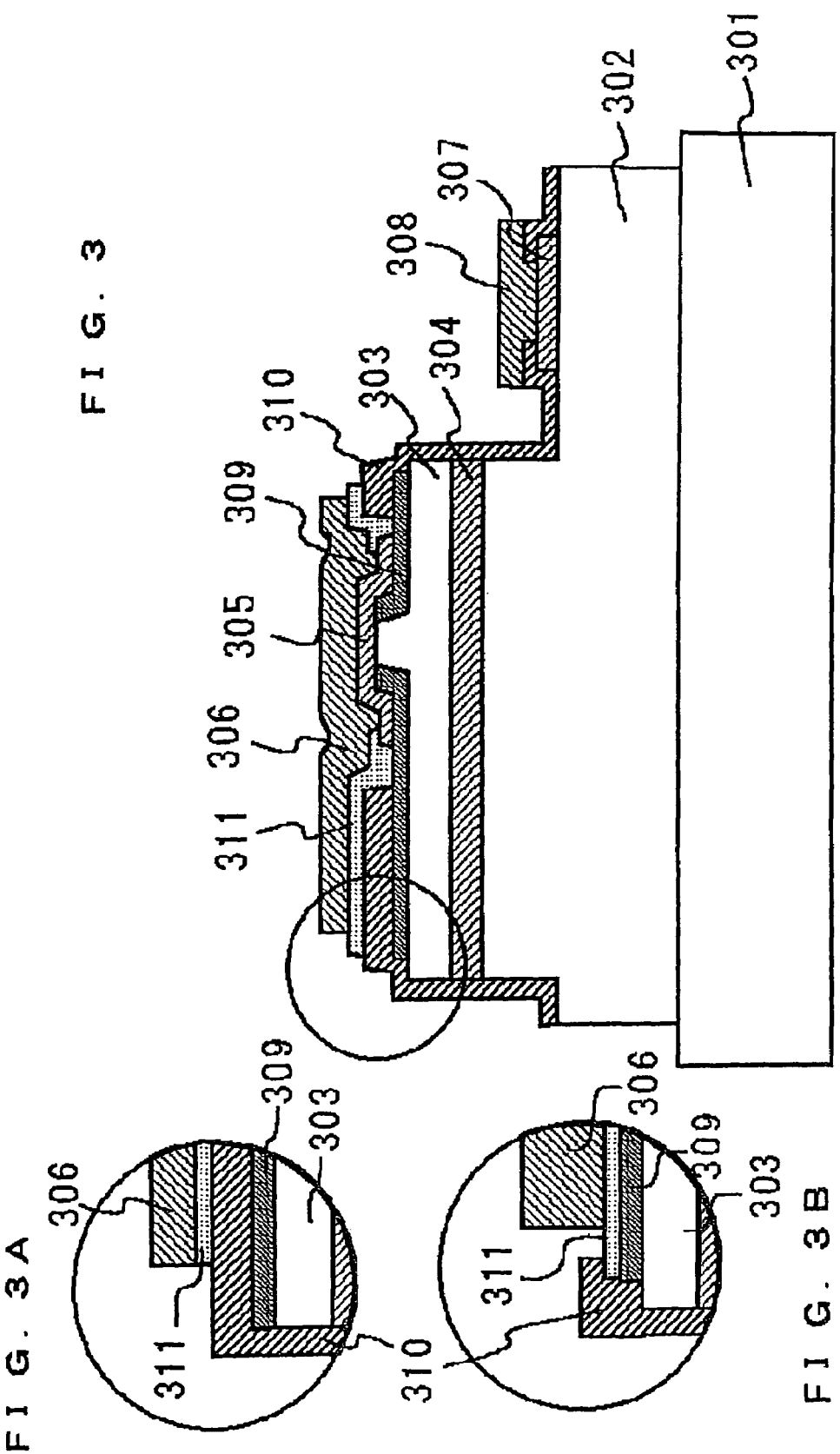

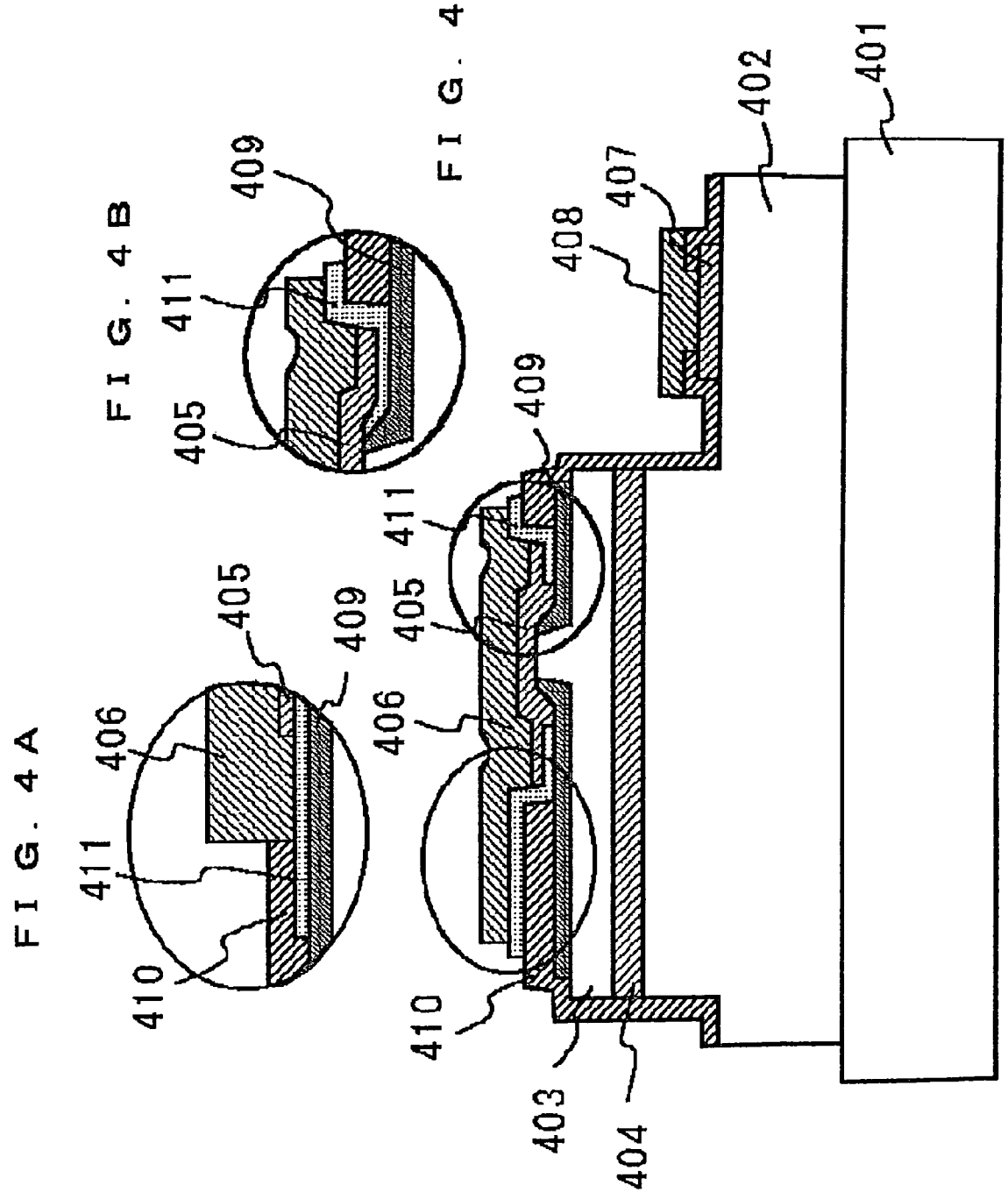

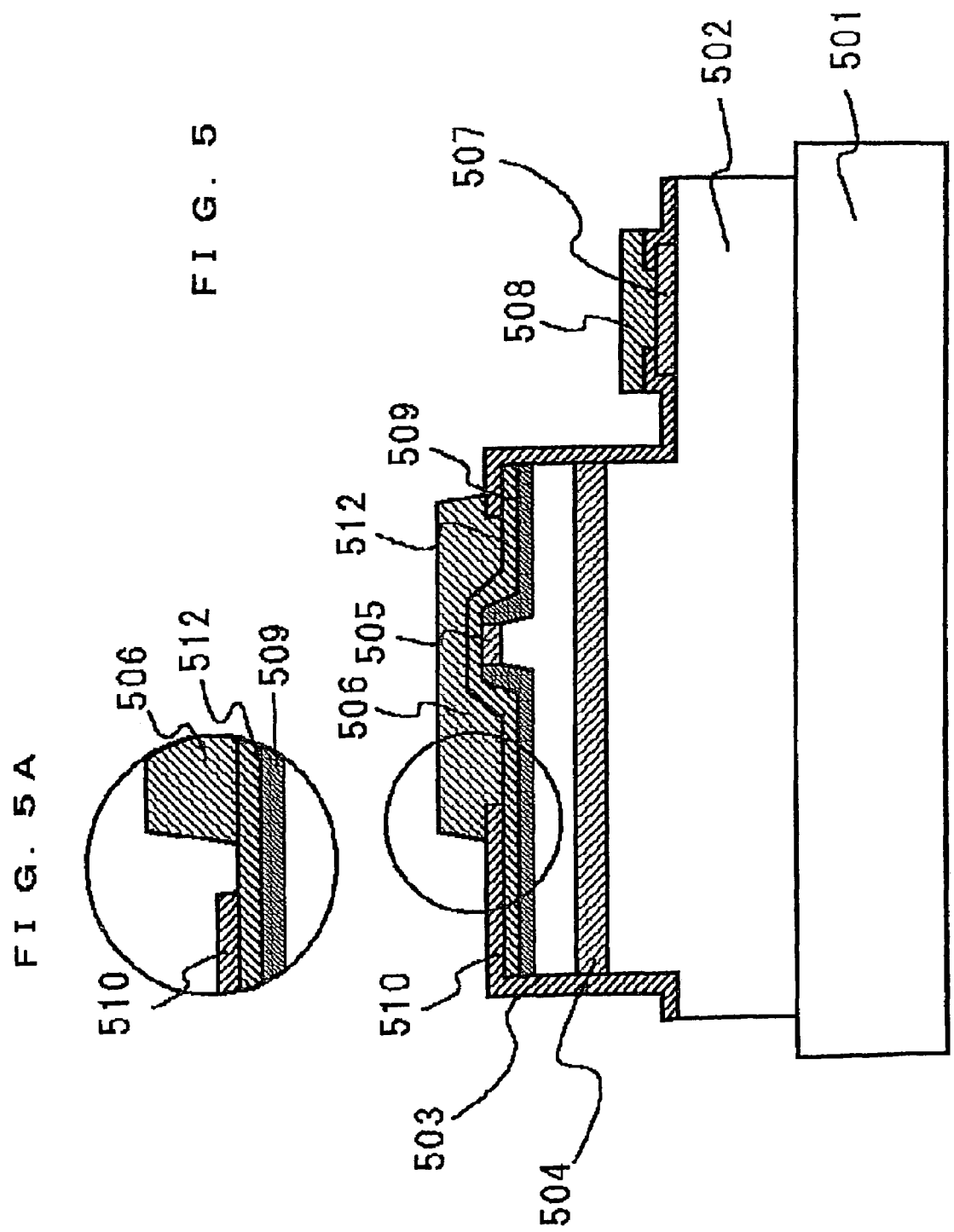

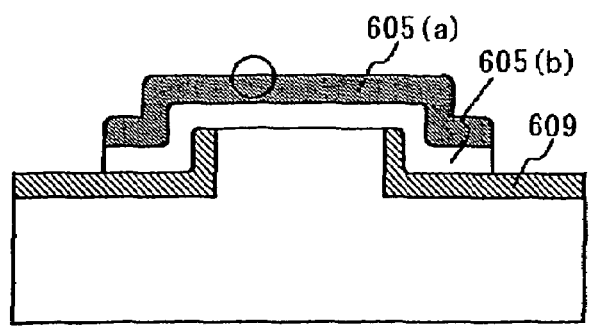
FIG. 6A
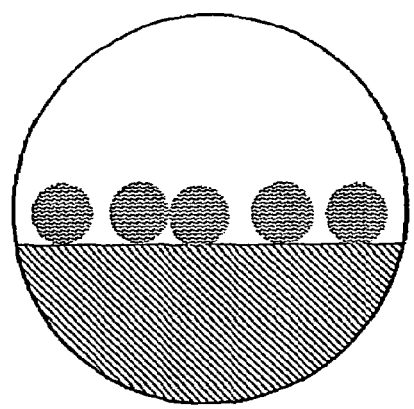
FIG. 6A1
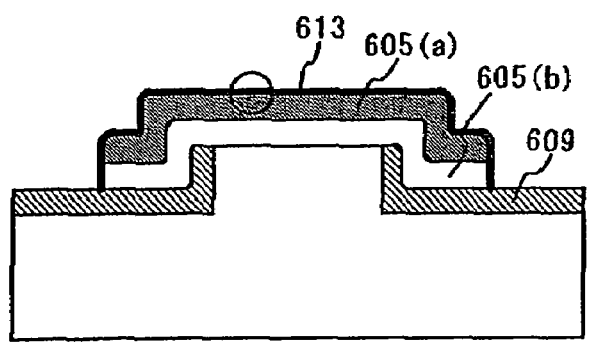
FIG. 6B
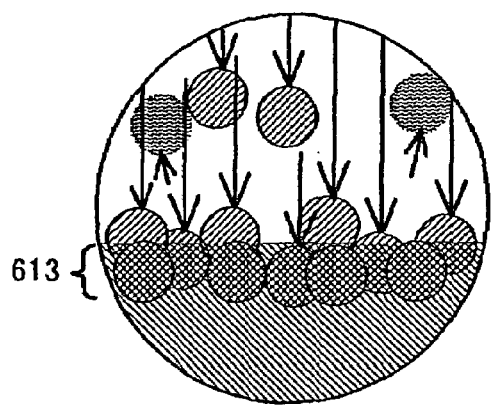
FIG. 6B1
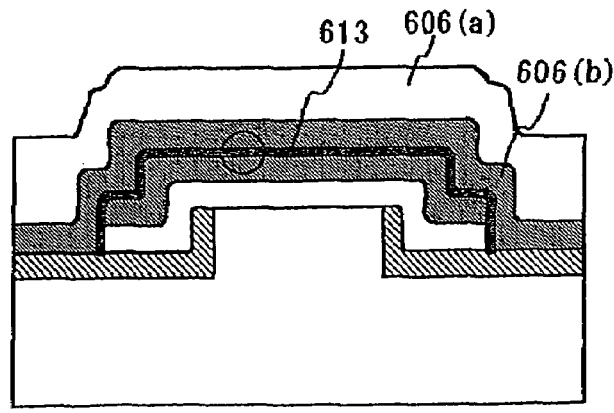
FIG. 6C
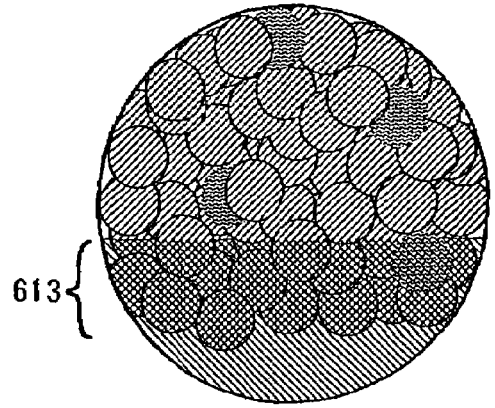
FIG. 6C1

NITRIDE SEMICONDUCTOR DEVICE

CROSS REFERENCE TO RELATED APPLICATIONS

This application is a continuation application of U.S. patent application Ser. No. 10/780,849 filed on Feb. 19, 2004 now U.S. Pat. No. 7,009,218, currently pending. This application is incorporated herein by reference.

BACKGROUND OF THE INVENTION

1. Field of the Invention

The present invention relates to semiconductor devices having micro-area (width) electrodes on nitride semiconductor layers, and particularly to high-current-driven electronic devices, such as laser diodes, high-power LEDs, FETs, and high-frequency devices. Such semiconductor devices comprise, for example, group III-V nitride semiconductors, such as GaN, AlN, and InN, including their mixed crystals AlGaN, InGaN, and AlInGa.

2. Discussion of the Related Art

Nitride semiconductor devices emit light having a wide range of wavelengths from a relatively short-wavelength ultraviolet region to a visible light region including that of red light, and are widely used for semiconductor laser diodes (LDs) and light emitting diodes (LEDs). The nitride semiconductor devices have been developed to increase miniaturization, increase lifetime, and enhance power. These devices have been principally used in electronic devices such as personal computers and DVDs, medical equipment, processing machinery, and light sources for optical fiber communication.

A typical nitride semiconductor device has a multilayer structure including a buffer layer, an n-type contact layer, a crack-free layer, an n-type cladding layer, an n-type light guide layer, an active layer, a p-type electron confinement layer, a p-type light guide layer, a p-type cladding layer, and a p-type contact layer, in that order, on a sapphire substrate. For an LED, it is not necessary to provide the light guide layers or the like. The multilayer structure is provided with n and p electrodes where the active layer is energized to emit light.

In the electrodes, portions establishing an ohmic contact between the electrodes and respective semiconductor layers play a key role, and are generally formed of a high-work-function metal element or an alloy in a single-layer or multilayer form. Some metals can establish ohmic contact with a semiconductor layer by only depositing the metals on the semiconductor layer. For example, a Pd/Pt/Au multilayer film may be used as a p electrode. For an electrode material which does not easily form an ohmic contact with the semiconductor layer only by deposition, heat treatment allows the electrode material to establish an ohmic contact. For example, a Ni/Au multilayer film can be alloyed to be a transparent p electrode functioning as an ohmic electrode by heat treatment.

The n and p electrodes each have a pad electrode for bonding a wire. If the substrate is non-conductive, pad electrodes are provided on both the n and p electrodes because the n and p electrodes are on the same side of the substrate. Since the ohmic contact can easily be formed on an n-type semiconductor layer, the ohmic electrode on an n electrode may be used as a lead wire bonding electrode. A metallized layer may be formed on the n electrodes, instead of wires, so that the device can be mounted face down.

In addition, an insulating layer is provided between the n and p electrodes. The insulating layer may be formed of a single-layer or multilayer oxide film. In an LD, the insulating layer is also used as a functional film having an additional function, such as a current restriction film for controlling a current-injection region or a reflective film provided on the surface of a resonator.

These nitride semiconductor devices are disclosed in, for example, Japanese Unexamined Patent Application Publication No. 2000-299528A.

However, the surface of the above-described Ni/Au electrode is liable to be damaged by heat treatment. Consequently, the resistance at the interface between the Ni/Au electrode and the pad electrode may be increased. If an insulating layer is in contact with the Ni/Au electrode, the insulating layer is degraded by heat thereby reducing adhesion to the electrode. The Pd/Pt/Au electrode does not readily cause such a problem because the Pd/Pt/Au electrode does not require heat treatment. However, an increase in the device temperature during operation may degrade the characteristics of the electrode due to heat, consequently increasing the operating voltage disadvantageously. In addition, a thin electrode or a wide electrode degrades adhesion or mechanical strength, thus causing a problem during high-current operation.

SUMMARY OF THE INVENTION

In view of the above-described disadvantages, the object of the present invention is to provide a nitride semiconductor device exhibiting a low threshold current and operating voltage and other superior characteristics which includes electrodes having a low contact resistance with a semiconductor layer and a low interface resistance between a pad electrode and an ohmic electrode and having superior adhesion to a semiconductor layer and an insulating layer.

According to an aspect of the present invention, a nitride semiconductor device is provided which includes a semiconductor layer, a first electrode for establishing an ohmic contact disposed on the semiconductor layer, and a second electrode on the first electrode, having a different shape from the shape of the first electrode. The first electrode includes an upper layer and a lower layer and is subjected to heat treatment. The second electrode also includes an upper layer and a lower layer. The upper layer of the first electrode and the lower layer of the second electrode are each formed of an element of the platinum group and form a joint region joining the first electrode to the second electrode. Thus, the electrodes exhibit superior adhesion and low operating voltage.

According to another aspect of the present invention, a nitride semiconductor device is provided which includes a semiconductor layer, a first electrode for establishing an ohmic contact disposed on the semiconductor layer, and a second electrode on the first electrode, having a different shape from the shape of the first electrode. The first electrode includes an upper layer and a lower layer and is subjected to heat treatment. The second electrode also includes an upper layer and a lower layer. The upper layer of the first electrode and the lower layer of the second electrode are formed of the same material and form a joint region joining the first electrode to the second electrode. Thus, the electrodes exhibit superior adhesion and low operating voltage.

The lower layer of the first electrode may be formed of a material alloyed by heat treatment. Since the material of the lower layer of the first electrode is changed to one form or another by heat treatment, the structure of the lower layer of the first electrode is varied from that before heat treatment. For example, a lower layer in a multilayer form may be changed to an alloyed single-layer form by heat treatment without maintaining the multilayer form. By forming the lower layer of the first electrode, which is in contact with the semiconductor layer, of a material alloyed by heat treatment, the resulting first electrode exhibits superior adhesion to the semiconductor layer in comparison with an electrode formed by only deposition. Some semiconductor compositions or electrode materials can establish an ohmic contact without heat treatment. However, a semiconductor device having low internal and external quantum efficiencies may generate some heat which causes property changes during operation. Heat treatment enhances the adhesion of the first electrode to the semiconductor layer and prevents the characteristics from being degraded by heat generated during device operation. In addition, the joint region formed with the upper layer of the first electrode and the lower layer of the second electrode, comprising an element of the platinum group enhances the adhesion between the first electrode and the second electrode. Thus, extremely superior adhesion is established from the semiconductor layer to the second electrode. Consequently, the device according to the present invention can operate on a low operating voltage, and have a superior reliability and stable characteristics without aging because the work voltage is kept constant even during high-power operation.

Even if the upper layer of the first electrode is formed of a material other than the platinum group while the lower layer of the first electrode is formed of the above-described material alloyed by heat treatment, good adhesion can be established as long as the upper layer of the first electrode and the lower layer of the second electrode are formed of the same elemental metal or highly conductive compound capable of maintaining the characteristics stable. However, such a material may not be used that allows the upper layer of the first electrode to react with the lower layer during heat treatment to alloy and produce an insulative oxide.

Thus, by forming the upper layer of the first electrode and the lower layer of the second electrode of the same elemental metal of the platinum group or the same alloy or conductive oxide of the platinum group metals, the resulting electrodes exhibit extremely low resistance, superior adhesion, superior reliability and stable characteristics that do not degrade over time.

The upper layer of the first electrode may be formed of an elemental metal of the platinum group consisting of Pt, Pd, Rh, Ir, Ru, and Os or an alloyed material essentially composed of homologous elements in the platinum group, i.e., Ru—Os, Rh—Ir, or Pd—Pt. These materials result in an upper layer of the first electrode that is relatively stable to heat. Accordingly, the upper layer of the first electrode is not easily alloyed with the underlying lower layer even if the lower layer is formed of a material alloyed by heat treatment. Although a reaction occurs at the interface between the upper and lower layers of the first electrode, it does not progress to the inside of the layers and, thus, the interface is maintained stable. By forming the upper layer of the first electrode and the lower layer of the second electrode of the same material, the resulting electrodes exhibit low resistance and stable operating characteristics. In particular, an alloyed material, not an elemental metal, of the platinum group, which has been alloyed by heat treatment, results in a hard layer because of its higher bonding strength than that of the simply deposited alloy. Also, the alloyed material of the upper layer does not react with the alloyed material of the lower layer to form an alloy. Thus, the layered structure including the upper layer and the lower layer is maintained even after heat treatment.

The surface of the upper layer of the first electrode tends to react with ambient air during heat treatment because it is exposed to air. However, the above-described layer of the platinum group does not easily react with the ambient air, and particularly does not produce highly non-conductive oxides. However, oxygen is probably adsorbed in one form or another on the surface of the first electrode as long as it is present. In particular, oxygen coordinates around atoms of the platinum group element because of catalysis of the element. This reaction is explained below.

FIGS. 6A to 6C are schematic illustrations of a ridge stripe and its vicinity of a nitride semiconductor laser device. The device includes a p-type nitride semiconductor layer with the ridge stripe, a first insulating layer 609 on both side surfaces and at both sides of the ridge stripe, a first electrode 605 on the upper surfaces from the ridge stripe to the first insulating layer 609, and a second electrode 606 on the first electrode 605. The first electrode 605 includes an upper layer 605($a$) and a lower layer 605($b$). The second electrode also includes an upper layer 606($a$) and a lower layer 606($b$). The upper layer 605($a$) of the first electrode and the lower layer 606($b$) of the second electrode form a joint region 613. As shown in FIG. 6A, oxygen is adsorbed or put on the upper surface of the upper layer 605($a$) of the first electrode, which is formed of a material of the platinum group after heat treatment of the first electrode. Then, when the second electrode is deposited by, for example, sputtering, the platinum group material of the second electrode is brought into collision with the surface of the first electrode at an accelerated speed by, for example, sputtering. At this moment, the platinum group material rejects the oxygen from coming into the inside of the first electrode and induces formation of the joint region 613, as shown in FIGS. 6B and 6B1. Thus, the upper layer 605($a$) of the first electrode and the lower layer 606($b$) of the second electrode share a region to form the joint region, as shown in FIGS. 6B, 6B1, 6C and 6C1.

The following is an explanation about how this reaction proceeds. Although oxygen is adsorbed or is attached to the platinum group material of the first electrode to temporarily bond to each other stably as shown in FIG. 6A, the bond is so weak as to be easily broken by an external force. This temporary, weak bond can be easily broken by impact when the platinum group material is brought into contact with the upper surface of the first electrode at a high speed by, for example, sputtering for depositing the second electrode. In addition to mechanical impact, such as sputtering, heat application can break the bond.

The platinum group material present on the surface of the first electrode becomes unstable or active after the oxygen is rejected, due to bond breakage. Thus, the second electrode is deposited on the first electrode with no boundary therebetween, thereby forming the joint region 613 where the constituents of the first and second electrodes are mixed. Specifically, there is no distinct boundary between the first electrode, which has been heat-treated, and the second electrode and the interface seems to have been formed by continuous deposition. If a stable oxide is formed on the surface of the first electrode even though it does not reach the inside, the bond of the oxide at the surface is not easily broken by sputtering. In contrast, the bond of oxygen simply put on the surface can be easily broken. Thus, the platinum group materials of the upper layer of the first electrode and the lower layer of the second electrode can be bonded to each other by preparing an oxygen-absent state or by collapsing the oxygen-present state by impact of deposition.

The upper layer of the first electrode formed of one of the above-listed materials has ductility and malleability. Accordingly, the material of the second electrode incoming at a high speed can easily enter the inside of the upper layer of the first electrode. The upper layer of the first electrode formed of an elemental metal of the platinum group or an alloyed material essentially composed of homologous elements in the platinum group, which have ductility and malleability but do not easily produce oxides at the surface even by heat treatment, makes it possible to establish the above-described bond with the material of the lower layer of the second electrode.

If the first electrode is formed of Au, which has the highest malleability in metal elements, the first electrode needs a lower layer formed of a metal element other than Au because ohmic contact between nitride semiconductors and Au is difficult to establish. In addition, since Au significantly and easily diffuses by heat treatment, an alloying reaction with the underlying lower layer easily proceeds inside the layer while oxygen is taken in from the outside. Consequently, the Au initially present in the upper layer moves inward to reduce the Au content in the upper layer or to expose a metal other than Au in the lower layer, and an oxide can be easily produced. Thus, the Au upper layer of the first electrode disadvantageously causes an insulative oxide to be produced in the interface with the second electrode to provide an electrical barrier and to degrade the adhesion with the second electrode. The operating characteristics are also negatively affected. By providing the upper layer of the first electrode using a platinum group material, the resulting electrodes exhibit a low resistance.

An upper layer of the first electrode formed of an alloy comprising nonhomologous elements of the platinum group, such as Pt—Ir, also facilitates the rejection of oxygen on the surface of the upper layer by sputtering. Thus, the upper layer of the first electrode can be bonded with the platinum group material of the lower layer of the second electrode in a state where oxygen is not easily present at the interface. Unfortunately, this type of alloy is hard and less ductile and, accordingly, the material of the second electrode incoming at a high speed does not easily enter the inside of this alloy. Consequently, the thickness of the resulting joint region is small. Thus, the bonding strength (bonding area) is reduced to some extent in comparison with ductile materials. However, this alloy can produce a good adhesion with the upper layer of the first electrode without any problems by forming the lower layer of the second electrode of different types of materials by simultaneous sputtering or the like.

In addition to the elemental metals of the platinum group and the above-described alloyable material comprising the platinum group metals, the upper layer of the first electrode may comprise a conductive compound containing a platinum group element and oxygen, such as rhodium oxide, palladium oxide, or ruthenium oxide. Although these materials are oxides, the upper layer of the first electrode formed of these oxides exhibits low resistance and superior adhesion to the second electrode. A compound containing a platinum group element and oxygen has a higher bonding strength with oxygen than that of an oxide (oxide with a low bonding strength) formed on only the surface of a platinum group metal layer or a platinum group alloy layer or that of the oxygen in a state where oxygen is adsorbed or put on the surface. If an oxide of the platinum group metals is used for the upper layer of the first electrode, therefore, the joint region may be formed by other mechanisms apart from the above-described mechanism in which the joint region is formed of an elemental metal or alloy of the platinum group to achieve a low resistance and a high adhesion.

Heat treatment for alloying an upper layer of the first electrode formed of an oxide of platinum group metals causes a thermal reaction in the layer. This upper layer of the first electrode probably maintains a stable interface with the lower layer of the first electrode, as in the upper layer formed of an elemental metal from the platinum group. However, the vicinity of the upper surface of the upper layer of the first electrode, which is in contact with the ambient air, is in a different state. While the elemental metal from the platinum group brings the surface into a stable state by temporarily adsorbing oxygen, the compound made of a platinum group element and oxygen has the ratio of the oxygen to the platinum group element gradually varying between the vicinity of the surface and the internal region of the upper layer such that gradual composition changes occur depending on the depth from the surface of the first electrode. The composition of the vicinity of the surface of the upper layer is gradually changed to, for example, a platinum group element-rich form or an oxygen-rich form depending on ambient conditions in the heat treatment. Thus, the initial composition that was stable just after deposition collapses and, thereby, the surface of the upper layer of the first electrode is activated. The activated surface is bonded with the platinum group element of the lower layer of the second electrode and, consequently, does not form a substantial boundary. Thus, the resulting electrodes exhibit a low resistance. This is unique to conductive oxides of the platinum group metals, and may result from catalysis.

In any case, activating or semi-activating the upper layer of the first electrode enables forming a tight bond with the material of the lower layer of the second electrode when the lower layer is deposited thereby achieving a joint region with no substantial interface state density or with gradually varied interface state densities. This joint region can be provided by forming an interface (contact area) of an elemental metal from the platinum group, which is hard to oxidize, or a conductive compound comprising a platinum group element, capable of maintaining the conductivity even if oxidized, between the first electrode and the second electrode. Thus, the resulting electrodes exhibit extremely low resistance and superior reliability.

The lower layer of the second electrode may comprise an elemental metal from the platinum group or an alloy including platinum group metals. The lower layer comprising an alloy including platinum group metals is made of a metal mixture film formed by simultaneously depositing at least two platinum group metals, but not of a film alloyed by heat treatment. The lower layer of the second electrode is easily affected by a reaction product produced on the surface of the first electrode by heat treatment or impurities remaining in an apparatus for depositing the second electrode, in the early stage of deposition.

If the first electrode and the second electrode, which influence the operation region or waveguide region of the device, can be continuously formed without transferring the device to another production stage, the occurrence of discontinuous interfaces resulting from the transfer of the device to another production stage can be prevented. However, while the first electrode requires heat treatment in order to establish an ohmic contact and to enhance the reliability of the resulting device, the second electrode, which functions as an extraction electrode, is subjected to no heat treatment or to milder heat treatment than that for the first electrode. Thus these two electrodes often have different functions and shapes. It is therefore preferable that the first electrode and the second electrode be formed in separate production steps. Accordingly, by forming the lower layer, which is deposited in the early stage of the formation of the second electrode after transforming it to another production, of an elemental metal of the platinum group or an alloy of the platinum group metals, the second electrode is prevented from reacting with an impurities on the surface of the first electrode and its remaining components, such as oxygen, in the apparatus for forming the second electrode. Thus an increase in resistance of the interface with the first electrode is prevented.

A lower layer of the second electrode is formed of a material other than the above-listed materials, such as Ti, and establishes good adhesion with a Pt upper layer of the first electrode. However, Ti immediately reacts with oxygen adsorbed or on the surface of the first electrode to form an oxide in the early stage of the deposition due to its ease in bonding to oxygen. Consequently, the first electrode and the second electrode are separated by oxygen or an oxide. It is undesirable to use Ti for the lower layer of the second electrode because titanium oxides are insulative and increase the resistance of the interface with the first electrode. A simply adhesive material, such as Ti, prevents peeling of the second electrode that causes an increase in resistance, but does not prevent a non-conductive intermediary larger from appearing that also causes an increase in resistance.

By forming the upper layer of the first electrode and the lower layer of the second electrode with the above-described platinum group materials, a joint region devoid of oxygen which causes high resistance between the first electrode and the second electrode can be achieved. The above-described platinum group materials may be used to form either of the upper layer of the first electrode or the lower layer of the second electrode to achieve favorable characteristics for the entire first electrode and second electrode. However, by forming the joint region between the first electrode and the second electrode of with these materials, the resulting electrodes exhibit extremely superior characteristics. In particular, by forming the upper layer of the first electrode and the lower layer of the second electrode using the same material from the platinum group, superior adhesion can be achieved. Most preferably, the upper layer of the first electrode and the lower layer of the second electrode are formed of Pt. Thus, the resulting device can work at a low operating voltage, and with excellent reliability and can sustain high-power operation for a longer period of time without degrading.

The nitride semiconductor device may further include an insulating layer on the surface of the semiconductor layer. The second electrode overlies the first electrode and the insulating layer. The first electrode is in contact with the semiconductor layer, and the contact region defines a current-conduction path. In order to efficiently inject current into a waveguide region in an LD, or into a luminescent layer in an LED, the position of the current-conduction path is controlled. In this instance, the layout of the first electrode is not controlled, but the insulating layer is formed on the surface of the semiconductor layer to provide a non-conductive region and, then, the first electrode is formed. Thus, the position of the current-conduction path can be easily controlled. Then, the second electrode is formed so as to overlie the first electrode and the insulating layer. Thus, current is allowed to flow efficiently to the first electrode.

The first electrode may extend in a stripe or ridge, and the insulating layer may be disposed at both sides of the stripe or ridge of the first electrode. In an LD as shown in FIG. 1, an insulating layer is provided at both sides of the stripe of the first electrode, and the second layer is disposed in such a manner as to cover both the first electrode and the insulating layer. Thus, the current-conduction path to the semiconductor layer is disposed in a desired position. In an LED having first grid electrodes or a striped electrode, an insulating layer is provided on the surface of the semiconductor layer exposed between the first electrodes. Thus, the insulating layer is disposed in such a manner as to be divided into a plurality of regions by the first electrodes. By dividing the insulating layer into a plurality of regions as above, light is efficiently extracted.

The semiconductor layer may have a ridge stripe (or ridge) and the first electrode may be disposed on the upper surface of the ridge stripe. Thus, the nitride semiconductor device functions as a laser device. The ridge stripe is an essential portion immediately under which a waveguide region (operation region) is provided. A high current flows through the ridge stripe, which has a small width, during device operation. Accordingly, by providing an electrode having the structure of the present invention on the upper surface of the ridge stripe, the resulting LD can exhibit extremely superior reliability.

The laser device may further include a first insulating layer extending from the side surfaces of the ridge stripe to the upper surface of the semiconductor layer and a second insulating layer extending from the upper surface of the first insulating layer to the side surfaces of the semiconductor layer. The second insulating layer is separate from the first electrode.

FIG. 7A shows a structure including an active layer 704, a semiconductor layer 703 having a ridge stripe, an insulating layer 709 provided on both side surfaces and at both sides of the ridge stripe, a first electrode 705 covering the side surfaces and an upper surface of the ridge stripe, and a second electrode 706 on the first electrode 705. If the lower layer of the first electrode is formed of a multilayer metal film to be alloyed by heat treatment, such as a Ni/Au film, the multilayer structure of the lower layer of the first electrode is changed by heat treatment. At this moment, this reaction proceeds not only inside the lower layer of the first electrode, but also at the interfaces between the lower layer and the semiconductor layer and between the lower layer and the upper layer of a platinum group metal to form active interfaces. Since the upper layer of the first electrode is formed of a platinum group metal, oxygen in the system is expelled through the interface between the upper layer and the lower layer because of the catalysis of the platinum group metal. Thus, the amount of oxygen or ambient air involved in a reaction inside the lower layer or a reaction between the lower layer and the semiconductor layer is appropriately controlled, so that the interface between the upper layer and the lower layer (designated by a heavy line) is stabilized. Thus, the platinum group metal upper layer of the first electrode functions as a cap layer for stably alloying the underlying lower layer by heat treatment.

Also, since the constituents of the lower layer of the first electrode do not move to the surface of the first electrode through the platinum group metal upper layer, the surface can be maintained stable. Therefore, a joint region 713 is formed between the first electrode and the second electrode without producing any insulating oxide derived from the constituents of the lower layer of the first electrode, on the upper surface of the first electrode.

The laser device may further include an adhesion layer comprising a single-layer film or a multilayer film disposed on the surface of at least one of the first insulating layer and the second insulating layer. In order to inject current into the semiconductor layer, the first electrode is in contact with the semiconductor layer, and the current injection region of the first electrode is limited, or extended so as to be in contact with the upper surfaces of the insulating layers on the semiconductor layer to prevent short circuiting. Electrode materials do not always adhere to the insulating layer. Accordingly, electrodes may peel off from the insulating layers to negatively affect the characteristics of the device, and specifically increase the resistance, even if good adhesion is secured between the first electrode and the second electrode. For such a case, the adhesion layer is provided for enhancing the adhesion between the second electrode and the insulating layers to prevent the electrodes from peeling and, thus to prevent the degradation of the characteristics of the device.

The upper surface of the adhesion layer may contain an element from the platinum group. Thus, adhesion with the second electrode is enhanced. However, the platinum group metals do not always adhere with the insulating layers, and are particularly less adhesive to an insulating layer formed of an oxide and they are liable to peel. In contrast, some metals are not suitable for electrodes, but can adhesively bond with the insulating layers. FIG. 7C schematically shows a multiple adhesion layer. The adhesion layer 711 includes a metal lower sublayer adhesive to the insulating layers and an upper sublayer formed of a platinum group metal, and is disposed on the first insulating layer 709 and the second insulating layer 710. Thus, the adhesion layer reduces the contact area of the second electrode 706 with the insulating layers and enhances the adhesions to the second electrode and the insulating layer. In particular, by disposing the adhesion layer 711 over both the first insulating layer 709 and the second insulating layer 710, as shown in FIG. 7C, the region W2 occupied by the second electrode 706 is composed of the region W1 in contact with the first electrode 705 and the region W3 in contact with the adhesion layer 711 and these regions are all formed of a platinum group metal. Hence, the entire interface with the second electrode is formed by metallic bonds, thus forming a joint region over a wide area. Consequently, extremely superior adhesion can be provided.

The upper surface of the adhesion layer may comprise the same material as the upper layer of the first electrode. Thus, the contact face of the second electrode to the upper layer of the first electrode and the upper surface of the adhesion layer do not easily become resistive, and the resulting electrodes exhibit superior adhesion because both are made of the same material.

The upper surface of the adhesion layer may comprise Pt. Thus, the adhesion layer establishes superior adhesion with the second electrode.

The adhesion layer may be in contact with one of the upper surface and the lower surface of the first electrode. The adhesion layer is intended to prevent the first insulting layer and the second insulating layer from coming in contact with the second electrode. Preferably, no insulating layer formed of an oxide or the like is exposed when the second electrode is deposited. By providing the adhesion layer whose upper surface is formed of a platinum group metal, the second electrode is tightly adhered. FIG. 3 shows an adhesion layer 311 on the first electrode. However, if the adhesion layer is formed before the first electrode, the adhesion layer is placed under the first electrode. Since the adhesion layer is not involved in current injection to the semiconductor layer, it may be disposed, for example, in the vicinity of the ridge stripe of an LD to control the optical characteristics. In particular, by providing an adhesion layer including a lower sublayer of Ti, which is highly adhesive to the insulating layers, in the vicinity of the ridge stripe, the adhesion layer can function as a light absorption region to control light confinement.

BRIEF DESCRIPTION OF THE DRAWINGS

FIGS. 1, 1A and 1B are schematic sectional views of a nitride semiconductor device according to a first embodiment of the present invention with three variations.

FIGS. 2 and 2A are schematic sectional views of a nitride semiconductor device according to a second embodiment of the present invention with two variations.

FIGS. 3, 3A and 3B are schematic sectional views of a nitride semiconductor device according to a third embodiment of the present invention with three variations.

FIGS. 4, 4A and 4B are schematic sectional views of a nitride semiconductor device according to a fourth embodiment of the present invention with three variations.

FIGS. 5 and 5A are schematic sectional views of a nitride semiconductor device according to a fifth embodiment of the present invention with two variations.

FIGS. 6A, 6B, 6C, 6A1, 6B1 and 6C1 are schematic sectional views of a forming process of a joint region between a first electrode and a second electrode of a nitride semiconductor device according to the present invention.

DETAILED DESCRIPTION OF THE PREFERRED EMBODIMENTS

Figure 7A:
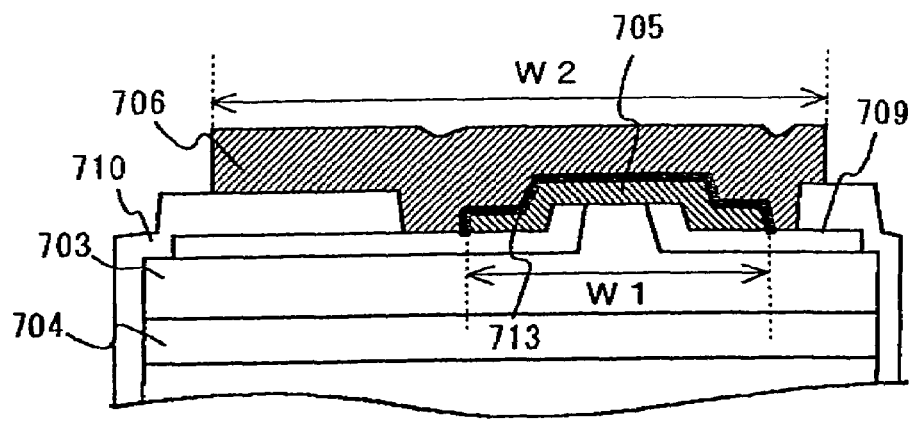
FIGS. 7A to 7C are schematic sectional views of a joint region between a first electrode and a second electrode of a nitride semiconductor device according to the present invention.

The preferred embodiments of the present invention will now be described in detail. However, the form and details of the nitride semiconductor device of the present invention are not limited to the structures described in the embodiments.

A nitride semiconductor device of the present invention includes a first electrode for establishing an ohmic contact provided on a semiconductor layer and a second electrode used mainly as a extraction electrode in contact with the first electrode. The interface between the first electrode and the second electrode has a specific structure to achieve superior adhesion, low interface resistance, and stable operating characteristics.

The first and second electrodes are given different functions, and the size and shape of the electrodes are determined according to the functions or manufacturing processes. It is not necessary that the surfaces of the first and second electrodes are entirely connected with each other as long as their operational areas are connected. In LEDs, for example, the thicknesses and shapes of the first and second electrodes are set so as to allow current to flow uniformly to a wide area of a luminescent layer. Preferably, the joint region of the first electrode to the second electrode is formed so as to allow current injection to the luminescent layer effectively, also in consideration of the arrangement of p and n electrodes. In a LD, one of the first electrode and the corresponding second electrode are brought into contact with each other over a ridge strip, thereby preventing the increase in operating voltage due to interface resistance. The second electrode, which is provided after the formation of the first electrode, may be formed such that its entire bottom surface comes in contact with the first electrode. Alternatively, part of the bottom surface may be brought into contact with the first electrode; the other parts, with the semiconductor layer or an insulating layer.

In the LDs, preferably, the first electrode is formed in a stripe parallel to a waveguide region in a ridge stripe, but it is not limited to this. Specifically, the first electrode is not necessarily formed in a stripe as long as the contact region of the first electrode with the semiconductor layer has a stripe shape. Preferably, the first electrode is disposed over the waveguide region of the ridge stripe, in parallel with the ridge stripe. However, the size and shape of the electrode may be appropriately selected from the viewpoint of the processes of electrode formation, such as photolithography, and downstream steps, such as chip formation. For example, the electrode may be disposed inward apart from the ends of the ridge stripe.

Preferably, the first electrode and the second electrode are joined to each other with a joint region corresponding to the entire waveguide region, from the viewpoint of the stability of its operating voltage. More preferably, the second electrode has a length smaller than that of the first electrode so as not to overlie cut regions between devices. This is because the second electrode, particularly if its uppermost layer is formed of Au, is difficult to cut due to the ductility of the electrode material. Since joining the electrodes over the ridge stripe helps current injected into the second electrode to flow to the semiconductor layer through the first electrode effectively, light can be stably confined within the waveguide region to maintain the shape of laser beams advantageously. Consequently, the threshold current and operating voltage become stable.

For the shape of the first electrode in the direction perpendicular to the ridge stripe, the first electrode lies over the ridge stripe. The first electrode is not necessarily spread to the regions far apart from the ridge stripe, but is formed to a width larger than or equal to that of the ridge stripe. Preferably, the widths in the right and left directions from the ridge stripe are the same. Preferably, the width of the first electrode is constant over the region from one end of the stripe or resonator to the other.

Preferably, the first electrode and the second electrode are connected to each other with a joint region having a width larger than or equal to that of the ridge stripe in the direction perpendicular to the ridge stripe. Thus, the operating voltage is stabilized. A joint width smaller than the width of the ridge stripe reduces the area from which current is injected, consequently increasing the operating voltage disadvantageously. In particular, it is preferable that the joint region be located over the ridge stripe. The second electrode has a width sufficient to be connected to a wire for wire bonding in a region other than the region over the ridge stripe. Since this region does not necessarily extend across the length of the stripe, the width of the second electrode may not be constant in the direction of the ridge stripe.

Figure 7B:
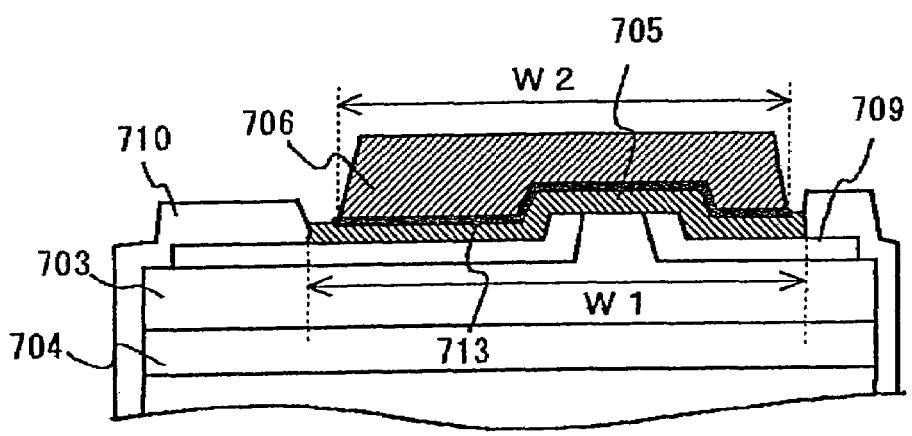
Figure 7C:
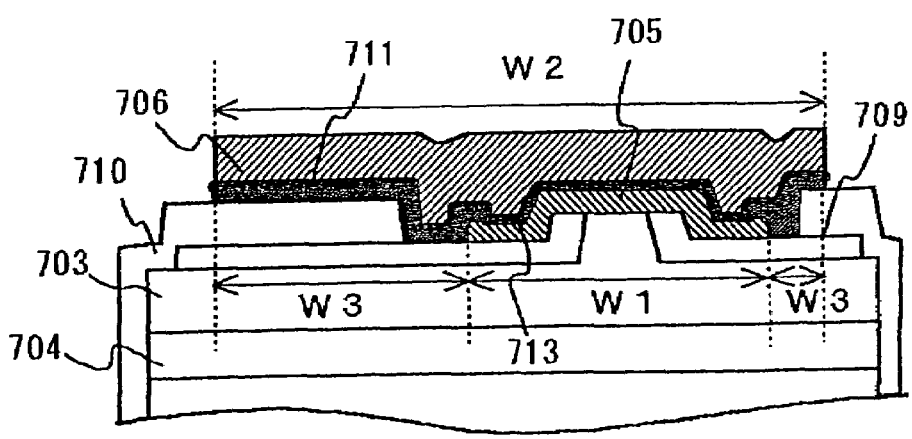

FIGS. 7A to 7C are each a schematic sectional view of a joint region between a first electrode and a second electrode of a nitride semiconductor device of the present invention. Preferably, the width W2 of the second electrode 706 is larger than the width W1 of the first electrode 705, as shown in FIG. 7A. In this instance, the insulating layer 710 ensures superior insulation of the device and, thus, the resulting device exhibits excellent reliability even when it outputs high power. For face-down mounting, the width W2 of the second electrode may be smaller than the width W1 of the first electrode to expose an insulating layer around the electrodes, as shown in FIG. 7B. The exposed insulating layer reduces the occurrence of short circuiting resulting from thermal expansion of the second electrode in face-down mounting, thus increasing process yield.

The above-described structure of the electrodes may be applied to both the p electrode and the n electrode or either of them. For LDs, it is preferable to apply this structure particularly to the p electrode. The electrode structure is effective in an LD having a ridge, among others. If the structure is applied to both the p electrode and the n electrode, the joint regions of the first p and n electrodes to the respective second p and n electrodes may be formed of the same element or different elements of the platinum group. Preferably, both the p and n joint regions are formed of Pt, thereby achieving extremely superior adhesion. This is, also, advantageous in view of the manufacturing process because the second p and n electrodes can be formed simultaneously using the same material.

The first electrode is subjected to heat treatment to establish a superior ohmic contact. The heat treatment is preferably performed at a temperature in the range of 350 to 1,200° C., more preferably in the range of 400 to 750° C., and most preferably in the range of 450 to 600° C.

The first electrode comprises an upper layer and a lower layer, and the upper layer may include an interlayer between an upper and a lower sublayer formed of an element of the platinum group. If the upper layer of the first electrode is of a single layer containing an element of the platinum group or an alloy constituted of homologous elements in the platinum group, the upper surface and lower surface of this layer functions differently. The upper surface makes the first electrode unreactive with ambient air and enhances the adhesion with the second electrode. The lower surface forms a stable interface with the underlying alloyed layer or lower layer to stabilize the alloying reaction. These two functions may be performed by different layers. For example, the first electrode has a Ni/Au lower layer and a Pt/Ti/Pt upper layer on a semiconductor layer. The upper layer may include upper and lower sublayers formed of an element of the platinum group and an interlayer formed of Ti, which is an element other than the platinum group, between the upper and lower sublayers. Thus, the lower sublayer of a platinum group element, which is in contact with the lower layer of the first electrode, reduces thermal decomposition and variation due to heat treatment, of the first electrode, thus achieving a device having superior reliability. The upper sublayer of a platinum group element, which overlies the interlayer, forms an interface exhibiting a very low probability of the presence of oxygen with the second electrode. Thus, the electrodes exhibit low resistance. The above-described functions can be performed by a different upper sublayer and a lower sublayer.

The interlayer of the upper layer of the first electrode separates the functions due to the material lying between the upper sublayer and the lower-sublayer. Furthermore, the interlayer makes up insufficient characteristics of the platinum group element sublayers. For example, the presence of the interlayer increases the thickness of the first electrode to enhance the heat dissipation effect. In addition, such a multilayer structure including three or more layers reduces stress in comparison with a single-layer structure having a large thickness. In a first electrode disposed on the ridge stripe of an LD, particularly, the multilayer structure reduces stress on the ridge stripe effectively because the first electrode is formed in an area with an extremely small width and the load placed on the ridge stripe significantly depends on the material of the first electrode. Also, light absorption coefficient of the electrode can be varied to control optical characteristics.

As described above, by forming the joint region, that is, the upper layer of the first electrode and the lower layer of the second electrode, of an element of the platinum group, the first electrode and the second electrode can adhere to each other tightly. In this instance, the lower layer of the first electrode and the upper layer of the second electrode may be formed of the following materials. These materials may be used for the upper layer of the first electrode and the lower layer of the second electrode when they are formed of the same element or compound.

A lower layer of the first n electrode disposed on an n-type semiconductor layer may comprise a single-layer or multilayer film exhibiting ohmic characteristics and high adhesion, containing, for example, an elemental metal of Ni, Co, Fe, Ti, Cu, Au, W, Zr, Mo, Ta, Al, Ag, Pt, Pd, Rh, Ir, Ru, or Os, or an alloy of these metals. Preferably, the lower layer of the first electrode has a multilayer structure of Ti and Al deposited in that order. After depositing the first electrode, heat treatment may be advantageously performed to enhance the ohmic contact with the semiconductor layer for some materials. The first n electrode preferably has a thickness in the range of about 100 to 30,000 Å, more preferably in the range of about 3,000 to 15,000 Å, and particularly in the range of about 5,000 to 10,000 Å. These ranges advantageously result in an electrode with a low contact resistance.

An upper layer of the second n electrode on the first n electrode may comprise a single-layer or multilayer film containing, for example, an elemental metal of Ni, Co, Fe, Ti, Cu, Au, W, Zr, Mo, Ta, Al, Ag, Pt, Pd, Rh, Ir, Ru, or Os, or an alloy of these metals. Preferably, the upper layer of the second n electrode is of a multilayer film including a Au uppermost sublayer to be connected to a wire or the like. Another sublayer, underlying the Au sublayer, is preferably formed of a material capable of preventing Au from diffusing, having a relatively high melting point. Such materials include Ti, Pt, W, Mo, and TiN. Preferably, the second n electrode has a thickness in the range of 3,000 to 20,000 Å, and more preferably in the range of 7,000 to 13,000 Å.

For an n electrode, the first electrode and the second electrode may be formed not in separate process steps, but in a series of continuous steps to form an electrode functioning as the first electrode or ohmic electrode for establishing an ohmic contact with a semiconductor layer and the second electrode or extraction electrode (pad electrode) to which an wire is bonded. This is because the ohmic contact is more easily established with an n-type semiconductor layer than a p-type semiconductor layer. In addition, since the optical characteristics of the n electrode do not need to be substantially considered because of its location distant from the waveguide region, the n electrode has a wide variety of choices in materials. Such an n electrode has a thickness preferably in the range of 3,000 to 20,000 Å, and more preferably in the range of 7,000 to 13,000 Å. If the n electrode is not separated into the first electrode and the second electrode, the structure of the present invention, may be applied to the p electrode.

A lower layer of the first p electrode disposed on an p-type semiconductor layer may comprise a single-layer or multilayer film exhibiting ohmic characteristics and high adhesion, containing, for example, an elemental metal of Ni, Co, Fe, Cr, Al, Cu, Au, W, Mo, Ta, Ag, Pt, Pd, Rh, Ir, Ru, or Os, or an oxide or a nitride of these metals. Preferably, the lower layer is formed of at least one element selected from the group consisting of Ni, Co, Fe, Cu, Au, and Al and their oxides and nitrides are used.

An upper layer of the second p electrode may comprise a single-layer or multilayer film containing, for example, an elemental metal of Ni, Co, Fe, Ti, Cu, Au, W, Zr, Mo, Ta, Ag, Pt, Pd, Rh, Ir, Ru, or Os, or an oxide or a nitride of these metals. Preferably, the upper layer of the second p electrode is of a multilayer film including a Au uppermost sublayer to be connected to a wire or the like. Another sublayer, underlying the Au sublayer, is preferably formed of a material capable of preventing Au from diffusing, having a relatively high melting point. Such materials include Ti, Pt, W, Ta, Mo, and TiN. Ti is particularly preferable. Preferably, the second p electrode has a thickness in the range of 3,000 to 20,000 Å, and more preferably in the range of 7,000 to 13,000 Å.

The upper layer of the first electrode may include an interlayer between the upper and lower sublayers formed of an element of the platinum group. The interlayer may be a single-layer or multilayer film of an element or an alloy. The constituent of the upper sublayer and the lower sublayer may be the same or different as long as these sublayers are formed of an element of the platinum group. The constituents of the upper and lower sublayers may be suitably selected separately in view of adhesions to the lower layer of the first electrode, the interlayer, and the extraction second electrode provided on the upper layer of the first electrode after alloying. If the first electrode is used as a mask to form a mesa portion, such as the ridge stripe, it is preferable that the platinum group element of the upper sublayer of the first electrode be selected in consideration of the etching gas used.

The interlayer of the upper layer of the first electrode may be formed of the same alloyed film as the lower layer of the first electrode because the interlayer lies between the stable platinum-group-element layers. The interlayer may be formed of other materials. A material not used as the lower layer may be used. Exemplary interlayer materials include Hf in addition to the above-listed lower layer materials, such as Ni, Co, Fe, Cu, Au, W, Mo, Ti, Ta, Ag, Al, Cr, Pt, Pd, Ph, Ir, Ru, Os, and their oxides and nitrides.

First Embodiment

FIG. 1 shows a nitride semiconductor device according to a first embodiment. The nitride semiconductor device is a semiconductor laser diode (LD) including an n-type nitride semiconductor layer 102, an active layer 104, and a p-type nitride semiconductor layer 103 deposited in that order on a substrate 101. The p-type nitride semiconductor layer 103 has a ridge stripe. The ridge stripe is formed by partially etching the p-type nitride semiconductor layer or other processes to function as an effective refractive-index waveguide. Alternatively, the ridge stripe may be formed by partially etching a region from the p-type semiconductor layer to the n-type nitride semiconductor layer to function as a real refractive-index waveguide, or by the selective growth method. The ridge stripe is not necessarily formed in a mesa manner shape, in which the width of the stripe is gradually reduced upward. For example, it may be in a reversed mesa manner, in which the width is reduced downward, a parallelepiped manner whose side surfaces perpendicular to the surfaces of layers, or in combination of these manners. The waveguide in the stripe does not necessarily have a constant width. After the completion of the ridge stripe, the semiconductor layer may be further deposited at both sides and on the surface of the ridge stripe to make an embedded laser device. Alternatively, the waveguide may have a gain waveguide structure without a ridge. The nitride semiconductor device may include a current constriction layer formed of a high-resistance film (insulative film). The current constriction layer may be provided in the n-type semiconductor layer or the p-type semiconductor layer, but preferably in the p-type semiconductor layer. More specifically, the current constriction layer, in the n-type or p-type semiconductor layer, may be provided in each boundary of the contact layer, cladding layer, guide layer, cap layer, active layer, and so forth, or in each layer of the contact layer, cladding layer, guide layer, and so forth. Since the formation of the current constriction layer requires that deposition be suspended, the current constriction layer, preferably, formed of a composition capable of preventing the formation of an insulative oxide layer, exhibits an interface state density to reduce the current injection efficiency. Alternatively, on resuming the deposition, a very small thickness of the redeposited film surface may be removed by etch-back techniques so that the surface causing the resistance to increase is eliminated. Exemplary materials of the current constriction layer include AlN and AlGaN with a high Al crystal ratio. Preferably, AlN is used because it is highly insulative and allows continuous deposition in succession to the preceding deposition in the same apparatus. In addition, since AlN is easily removed with an acid or the like, a current conduction region, which is formed by removing the AlN, can be readily provided without damaging other portions of the device. Furthermore, AlN is suitable for light confinement because of its low refractive index. The current constriction layer has a thickness sufficient to block current. For the formation of a current conduction region as the waveguide region, selective growth may be applied to the region other than the current conduction region, or an opening may be provided in the continuously deposited layer.

A first insulating layer 109 extends from the side surfaces of the ridge stripe to the upper surfaces of the p-type nitride semiconductor layer 103 continuing from the ridge stripe. A first p electrode 105 extends over the upper surfaces of the ridge and the first insulating layer 109, and a first n electrode 107 extends on the upper surface of the n-type nitride semiconductor layer 102. A second insulating layer 110 having an opening at the upper surface of the first n electrode 107 extends from the upper surface of the first n electrode 107 to the upper surface of the first insulating layer 109. A second p electrode 106 in contact with the second insulating layer 110 and first p electrode 105 is provided over the p-type nitride semiconductor layer 103. A second n electrode 108 is also provided on the first n electrode 107.

In order to direct the ridge stripe in the direction of the resonator, a pair of resonance planes may be provided on the end surfaces of the device by cleavage or etching. For cleavage, the substrate and the semiconductor layer must have cleaving characteristics facilitating the formation of specular surfaces. Otherwise, the resonance planes can be formed by etching. In this instance, the etching may be performed simultaneously with the step of exposing the surface of the n electrode to reduce the total number of production steps. Alternatively, the resonance planes may be formed together with the formation of the ridge stripe. Although the resonance planes may be formed simultaneously with any other step to reduce the total number of steps, as above, they are preferably provided in a separate step from the viewpoint of preparing superior resonance planes. The resulting resonance planes by cleavage or etching may have a single-layer or multilayer reflective layer to efficiently reflect light emitted from the active layer 104. One of the resonance planes has a relatively high reflectance so as to reflect light inside the waveguide region, and the other face has a relatively low reflectance so as to allow light to go outside.

In the first embodiment, the second insulating layer 110 and the first p electrode 105 are separated. A first p electrode may be provided in such a manner as to cover the surface of the p-type nitride semiconductor layer. However, the first p electrode having such a large area tends to peel off unless the adhesion of the first p electrode to the first insulating layer is good. In the first embodiment, the first p electrode 105 lies at least in the vicinity of both side surfaces of the ridge stripe, apart from the ends of the p-type nitride semiconductor layer 103. Thus, the contact area of the first p electrode 105 with the first insulating layer 109 is reduced to prevent the electrode from peeling even if the adhesion to the first insulating layer 109 is low, in comparison with the case where the first electrode is formed from one end to the other across the surface of the semiconductor layer. In addition, the first p electrode 105 is separate from the second insulating layer 110. Accordingly, the second p electrode 106 is in contact with the first insulating layer 109. The second insulating layer 110 has relatively thick portions to prevent short circuiting between the p-side electrodes and the n-side electrodes. Consequently, rather deep recesses are formed between both sides of the ridge stripe and the second insulating layer 110 to increase the irregularity at the joint surface of the second p electrode 106. This irregularity increases the contact surface so as to prevent the second electrode from peeling.

On the other hand, since the first insulating layer 109, which is provided to limit current injection to the region at the upper surface of the ridge stripe, lies close to the waveguide region of the ridge stripe, the thickness of the first insulating layer 109 affects the efficiency of light confinement. Therefore, the thickness may not be readily increased. However, some insulting layer materials require a small thickness. A thin first insulating layer may have rather low-insulation portions. Even in such a case, current injection is limited to the vicinity of the ridge stripe by expanding the second insulating layer 110 to the regions relatively close to the ridge stripe between the second p electrode 106 and the first insulating layer 109.

The first insulating layer 109 may also have the same width as the p-type nitride semiconductor layer 103, as shown in FIG. 1A. The first insulating layer 109, which is formed before the formation of the first p electrode 105, undergoes heat treatment when the first p electrode 105 is subjected to heat treatment. The heat treatment increases the strength or atomic bonding force of the insulating layer in comparison with a simply deposited insulating layer, thus increasing the adhesion at the interface with the p-type nitride semiconductor layer 103. By extending the first insulating layer 109 to the ends of the upper surface of the p-type nitride semiconductor layer 103, where the second insulating layer 110 is disposed, the adhesion of the second insulating layer 110 can be increased.

The second p electrode 106 may be formed not to be in contact with the second insulating layer 110, as shown in FIG. 1B. In particular, if the device is mounted face down, heat is conducted to the second p electrode 106 to increase the volume of the electrode due to thermal expansion. Thus, the second p electrode 106 tends to extend toward the side surfaces of the p-type nitride semiconductor layer 103. In addition to heat, pressure is placed on the second p electrode 106 and, consequently, the second electrode tends to extend toward the side surfaces. Therefore, it is desirable that the second p electrode 106 is separated from the second insulating layer 110 to prevent short circuiting resulting from the extension of the second p electrode 106.

Preferably, the first insulating layer, not only in the first embodiment but also in the subsequent embodiments, is formed of at least one compound selected from the group consisting of SiN, BN, SiC, AlN, AlGaN, and oxides containing at least one element selected from among Si, Ti, V, Zr, Nb, Hf, and Ta. More preferably, BN, AlN, AlGaN, and oxides of Zr, Hf, and Si are used.

Preferably, the thickness of the first insulating layer is set in the range of 10 to 10,000 Å, and more preferably in the range of 100 to 5,000 Å. This is because a thickness of less than 10 Å impairs secure insulation and a thickness of more than 10,000 Å adversely affects the uniformity of the insulating layer to result in a degraded insulation. In addition, the above-described preferred range leads to a uniform layer having a good difference in refractive index from that of the ridge stripe at the sides of the ridge stripe.

The second insulating layer 110 may be provided over the entire surface of the composite except the upper surface of the ridge stripe, preferably including the side surfaces of the p-type nitride semiconductor layer 103 and active layer 104, which have been exposed by etching. Preferably, the second insulating layer 110 is formed of at least one compound selected from the group consisting of SiN, BN, SiC, AlN, AlGaN, and oxides containing at least one element selected from among Si, Ti, V, Zr, Nb, Hf, and Ta. More preferably, the second insulating layer 110 comprises a single layer or multilayer film of $SiO_2$, $Al_2O_3$, $ZrO_2$, or $TiO_2$.

Second Embodiment

FIG. 2 shows a nitride semiconductor device according to a second embodiment of the present invention. The nitride semiconductor device is a semiconductor laser diode (LD) including an n-type nitride semiconductor layer 202, an active layer 204, and a p-type nitride semiconductor layer 203 deposited on a substrate 201, as in the first embodiment. The p-type nitride semiconductor layer 203 has a ridge stripe. A first p electrode 205 is formed so as to cover a wide region of a first insulating layer 209. A second insulating layer 210 is formed so as to overlap the first p electrode 205 in regions apart from the ridge stripe. A second p electrode 206 is formed on the first p electrode 205 and the second insulating layer 210. Hence, in second embodiment, the second p electrode 206 is not in contact with the first insulating layer 209. The light confinement in the waveguide region may be varied depending on the depth (height) of the ridge stripe of the first insulating layer 209, and the light confinement may be controlled by increasing the thickness of the first insulating layer 209. In this instance, the first p electrode 205 having a large area helps to reduce heat concentration and increases the joint region of the first and second electrodes 205 and 206 to enhance the adhesion.

The second p electrode 206 may be disposed in such a manner as not to be in contact with the second insulating layer 210, as shown in FIG. 2A. Thus, the second p electrode less adhesive to insulating layers is in contact with only the first p electrode 205 and, consequently the second p electrode 206 becomes hard to peel. Furthermore, although heat application in face-down mounting may cause deformation of the second p electrode 206, as described in the first embodiment, this structure prevents the deformed second p electrode from spreading to the n-type nitride semiconductor layer 202 to achieve an device exhibiting high reliability.

Third Embodiment

FIG. 3 shows a nitride semiconductor device according to a third embodiment of the present invention. This nitride semiconductor device is a semiconductor laser diode (LD) including an n-type nitride semiconductor layer 302, an active layer 304, and a p-type nitride semiconductor layer 303 deposited on a substrate 301, as in the first embodiment. The p-type nitride semiconductor layer 303 has a ridge stripe. In the third embodiment, an adhesion layer 311 is provided between a second p electrode 306 and at least one of a first insulating layer 309 and a second insulating layer 310. The adhesion layer 311 increases the adhesion between the second p electrode 306 and the first insulating layer 309 or the second insulating layer 310, and is not placed on the upper surface of the ridge stripe, where a first p electrode 305 is joined to the second p electrode 306, or the vicinity of the upper surface.

The electrodes and insulating layers must have good adhesiveness not only to the underlying layers, but also to the overlying layers. These requirements are satisfied by using different materials for the upper layer and lower layer in each electrode. The adhesion layer 311 further enhances the adhesion. FIG. 3 shows that part of the adhesion layer 311 lies between the first p electrode 305 and the second p electrode 306. Alternatively, the adhesion layer 311 may be formed not to be in contact with the first p electrode 305.

The material of the adhesion layer 311, unlike the first p electrode 305, is not required to have a low contact resistance with the p-type nitride semiconductor layer 303, nor superior adhesion to the semiconductor layer 303. The material is not also required to reduce the interface resistance between the first p electrode 305 and the second p electrode 306. In addition, the material does not need to have both high adhesion to the electrodes and high insulation as much as those of the first and second insulating layers 309 and 310. Specifically, the adhesion layer 311 may be conductive or insulative, and requires only adhesion to the insulating layers and electrodes. Accordingly, the adhesion layer 311 may be formed of a high-resistance material unsuitable for use as an electrode, as long as the material is adhesive to the insulating layers 309 and 310. Furthermore, the adhesion layer 311 is formed in a multilayer form in which the uppermost sublayer is formed of a material adhesive to the second p electrode 306, thus enhancing the adhesion.

The adhesion layer 311 may comprise a single-layer or multilayer film. For a multilayer film, the lowermost sublayer of the adhesion layer 311 is formed of a material adhesive to the insulating layers, and the uppermost sublayer is formed of a material adhesive to the second p electrode 306. Thus superior adhesion can be provided.

As a preferable material for the adhesion layer, a conductive material or an insulating material can be used. If the upper layer of the first p electrode 305 is made of Pt; the lower layer of the second n electrode 306, Rh; and their joint region, an element of the platinum group, the uppermost sublayer of the adhesion layer 311 may be made of an element other than the elements of the platinum group, such as Au. Also, if both the upper layer of the first p electrode 305 and the lower layer of the second p electrode 306 are formed of the same material, such as Pt, the uppermost sublayer of the adhesion layer 311 may be formed of a different material, such as Au. It is particularly preferable that the uppermost sublayer of the adhesion layer 311 be formed of an elemental metal of the platinum group or an alloy constituted of homologous elements in the platinum group. If, for example, the upper layer of the first p electrode 305 is formed of Pt; the lower layer of the second p electrode 306, Rh; and their joint region, an element of the platinum group, the uppermost sublayer of the adhesion layer 311 is preferably formed of Pt so that all the layers in the joint region are composed of elements of the platinum group. If both the upper layer of the first p electrode 305 and the lower layer of the second p electrode 306 are formed of the same Pt, the uppermost sublayer of the adhesion layer 311 is preferably formed of Pt so that all the layers in the joint region are composed of the same element. Since the second p electrode 306 is provided on layers with irregular surfaces formed of the same material, the above-described structures help establish extremely excellent adhesion. Pt is particularly preferable, among elements of the platinum group. The lowermost sublayer of the adhesion layer 311 is preferably formed of Ti.

The adhesion layer 311 is preferably larger than the second p electrode 306. However, the adhesion layer 311 and the second p electrode 306 may have substantially the same size, as shown in FIG. 3A. Alternatively, the adhesion layer 311 may be positioned under the second insulating layer 310, as shown in FIG. 3B. Thus, short circuiting in face-down mounting can be prevented.

Fourth Embodiment

FIG. 4 shows a nitride semiconductor device according to a fourth embodiment of the present invention. This nitride semiconductor device is a semiconductor laser diode (LD) including an n-type nitride semiconductor layer 402, an active layer 404, and a p-type nitride semiconductor layer 403 deposited on a substrate 401, as in the first embodiment. The p-type nitride semiconductor layer 403 has a ridge stripe. In the fourth embodiment, an adhesion layer 411 is provided between a first p electrode 405 and a first insulating layer 409. This structure is provided by forming the adhesion layer 411 before forming the first p electrode 405. In this structure, since the adhesion layer 411 is located closer to the p-type nitride semiconductor layer 403, light confinement in the waveguide region can be controlled by varying the position of the adhesion layer 411. If a material, selected as the lower layer of the first p electrode 405 in consideration that the material is good for the ohmic contact with the p-type semiconductor layer 403, has significantly high light absorption coefficient, the optical characteristics may be degraded. In this instance, by providing the adhesion layer 411 under the first electrode 405, this negative effect can be alleviated. In addition, peeling of the first electrode 405 from the first insulating layer 409 can be avoided even if the adhesion between the first p electrode 405 and the first insulating layer 409. Since the adhesion layer 411 is formed before the first p electrode 405, the adhesion layer 411 is also subjected to heat treatment. Consequently, the adhesion between the first insulating layer 409 and the adhesion layer 411 can be enhanced.

Furthermore, by forming the adhesion layer 411 which reaches the upper surfaces of the second insulating layer 410, peeling off of the second electrode 406 which causes degradation of device properties can be prevented. The adhesion layer 411 may be formed on the surface of the first insulating layer 409 in such a manner as not to overlap the second insulating layer 410 and the second electrode 406 or as to be separated, as shown in FIG. 4A. Thus, short circuiting in face-down mounting can be prevented. Alternatively, the adhesion layer 411 may extend to the top of the first insulating layer 409 on the side surfaces of the ridge stripe, as shown in FIG. 4B. Since the adhesion layer is disposed close to the waveguide region, ripple can be reduced due to, for example, absorption of stray light. Thus, a superior far field pattern (FFP) can be provided.

Fifth Embodiment

FIG. 5 shows a nitride semiconductor device according to a fifth embodiment of the present invention. This nitride semiconductor device is a semiconductor laser diode (LD) including an n-type nitride semiconductor layer 502, an active layer 504, and a p-type nitride semiconductor layer 503 deposited on a substrate 501, as in the first embodiment. The p-type nitride semiconductor layer 503 has a ridge stripe. In the fifth embodiment, a first p electrode 505 is disposed only on the upper surface of the ridge stripe. In order to form the first p electrode 505 with the same width as the ridge stripe of a narrow LD, the first electrode 505 is deposited at a desired width on a flat semiconductor layer, and the semiconductor layer is etched to form a ridge stripe through the first electrode 505 as a mask. In such a self-aligning process applied to etching of semiconductors, dry etching is preferably performed using a chlorine-based gas. In this instance, the first p electrode 505 functioning as an etching mask has an upper layer formed of an element of the platinum group. The surface of the first p electrode 505 is relatively smooth even after etching. If the first electrode 505 is formed after the formation of the ridge stripe, a semiconductor layer is etched through a $SiO_2$ or resist mask with a desired ridge width. After removing the mask, the first electrode 505 is deposited in the region where the mask has been removed, on the semiconductor layer. Therefore, part of the mask may be left on the surface of the semiconductor layer. This remaining mask may reduce the ohmic contact properties and adhesion between the first p electrode 505 and the semiconductor layer. In contrast, the structure of the fifth embodiment reduces the possibility of such problems.

As mentioned in FIG. 5, the first p electrode 505 with substantially the same width as the ridge stripe, limits the contact area between the first p electrode 505 and the second p electrode 506 to the width of the ridge stripe. Accordingly, by providing a joint region of a platinum group element using the upper layer of the first p electrode 505 and the lower layer of the second p electrode 506, an extremely good adhesion can be established even in a small contact area. In addition, the increase in interface resistance can be prevented and, thus, the resulting device exhibits a low operating voltage and stable and reliable operating characteristics. If a metal layer 512, described later, is disposed between the first and second p electrodes 505 and 506, the joint region is provided between the first electrode 505 and the metal layer 512 and between the metal layer 512 and the second electrode 506 to provide the same effects.

When the ridge stripe is formed in a self-aligning process, the upper surface of the first p electrode 505 is exposed to a chlorine-based gas which is used for etching a semiconductor layer or a fluorine-based gas which is used for etching a $SiO_2$ layer thereby producing a chloride or a fluoride, but not oxide. However, the layer of an element of the platinum group limits the reaction with the chlorine-based gas or the fluorine-based gas to the vicinity of its surface. The composition inside the upper layer of the first p electrode 505 is, therefore, maintained as it was when deposited. If the chlorine or fluorine product is stable and insulative, the surface of the upper layer is cleaned so as to expose a region inside the upper layer not containing the product because an interface resistance occurs at the interface between the product and the second p electrode 506. Then, the second electrode is formed on the exposed region to prevent the ohmic characteristics from deteriorating.

For the etching process to expose the n-type nitride semiconductor 502 to be a metal layer 512 shown in FIG. 5 may be used as a mask. The metal layer 512 is formed of, for example, an element of the platinum group to a predetermined shape on the first p electrode 505, and etching is performed until the n-type nitride semiconductor layer 502 is exposed. The metal layer 512 used as a mask may be removed or left on the layer. If the metal layer 512 is left as part of the electrodes, it is preferable that the first insulating layer 509 be disposed at both sides of the ridge stripe in advance and that, then, the first insulating layer 509 and the upper surface of the ridge stripe be covered with the metal layer 512 to form the structure as shown in FIG. 5. In this instance, the metal layer 512, which is in contact with the first electrode 505, is formed of an element of the platinum group to function as the lower layer of the second electrode 506. Preferably, the metal layer 512 is formed of platinum.

The etching mask for exposing the n-type nitride semiconductor 502 may be a $SiO_2$ film or the like. In this case, the $SiO_2$ film is removed after the n-type nitride semiconductor layer 502 has been exposed, and the first insulating layer 509 is formed on both sides of the ridge stripe. Then, the second p electrode 506 is formed in contact with the first electrode 505.

The second p electrode 506 may not be in contact with the second insulating layer 510, as shown in FIG. 5A, to prevent a short circuit in face-down mounting. In addition, since the second p electrode 506 is in contact with only the metal layer 512, the adhesion between the electrodes can be enhanced.

Sixth Embodiment

Figure 8A:
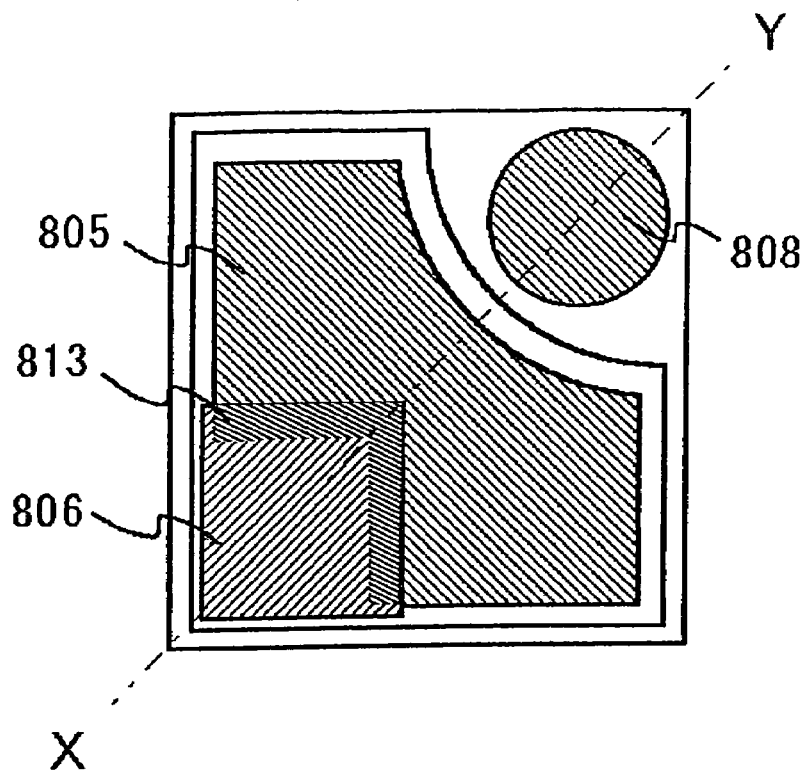
FIGS. 8A and 8B are schematic sectional views of a nitride semiconductor device according to a sixth embodiment of the present invention.
Figure 8B:
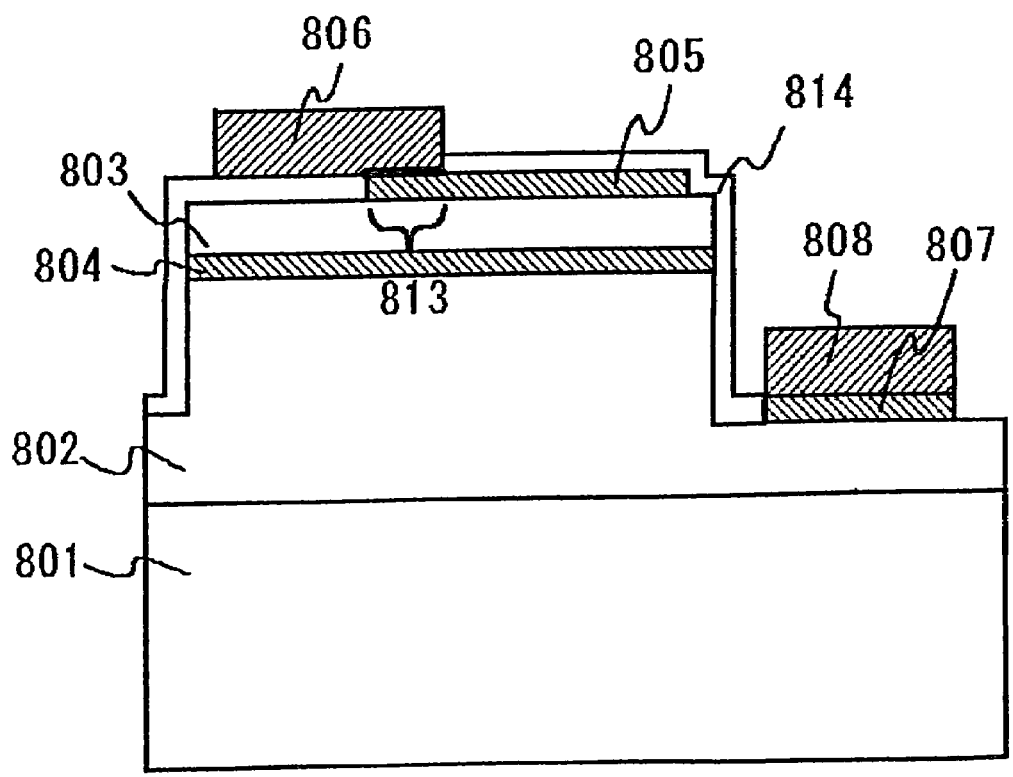

FIGS. 8A and 8B show a nitride semiconductor device according to a sixth embodiment of the present invention. FIG. 8B is a sectional view taken along line X-Y in FIG. 8A. The nitride semiconductor device is a light-emitting diode (LED) including an n-type nitride semiconductor layer 802, an active layer 804, and a p-type nitride semiconductor layer 803 disposed, in that order, on a substrate 801. The p-type nitride semiconductor layer 803 is provided with a first p electrode 805 and a second p electrode 806 on its upper surface, and the n-type nitride semiconductor layer 802, which is exposed by etching from the p-type nitride semiconductor layer side, is provided with a first n electrode 807 and a second n electrode 808 on its surface. The LED does not have a ridge stripe as in LDs, and light emitted from the active layer 804 is radiated to outside through the p-type nitride semiconductor layer 803, n-type nitride semiconductor layer 802, or side surfaces of the composite. The first p electrode 805 is disposed over substantially the entire upper surface of the p-type nitride semiconductor layer 803 and is joined with the second p electrode 806 in a joint region 813. The first electrode 805 has a thickness capable of transmitting light from the active layer 804, and is subjected to heat treatment so that a transparent electrode comes into ohmic contact with the p-type nitride semiconductor layer 803.

In the LED according to the sixth embodiment, the joint region between the transparent first p electrode 805 and the pad second p electrode 806 is small and, accordingly, a high current flows in the joint region 813 when the electrodes are energized. Therefore, by providing the joint region 813 with a good adhesion and a low resistance, the resulting LED exhibits superior reliability.

The LED is not limited to the shape shown in FIGS. 8A and 8B. For example, the first p electrode 805 may have a large thickness to reduce the sheet resistance and an opening for extracting light. In another form of the LED, the p-type nitride semiconductor layer 803 has an uneven surface whose recesses are filled with an insulating film. Thus, various modifications may be made.

EXAMPLES

Examples of the nitride semiconductor device of the present invention will now be described using semiconductor laser devices. The form of the present invention is, however, not limited to these laser devices and the invention may be applied to other nitride semiconductor devices including an n-type nitride semiconductor layer, an active layer, and a p-type nitride semiconductor layer. In addition to these laser devices having the following structures, the present invention may be applied to other lasers and LEDs. Exemplary nitride semiconductors include Group III-V nitride semiconductors such as GaN, AlN, and InN, including their mixed crystals AlGaN, InGaN, and AlInGa. These nitride semiconductors may further contain B, P, or the like. Nitride semiconductors are deposited by metal organic phase epitaxy (MOVPE), metallorganic chemical vapor deposition (MOCVD), hydride vapor phase epitaxy (HVPE), molecular beam epitaxy (MBE), or any other deposition process.

Example 1

Substrate

A c-plane sapphire is used as the substrate. However, the substrate is not particularly limited to this, and may be comprise an R-plane or A-plane sapphire, SiC, Si, spinel, GaN, or any other material. For a GaN substrate, a nitride semiconductor layer (AlGaInN) is deposited by epitaxial lateral overgrowth (ELOG) in which a growing substrate, such as sapphire and GaAs, provided with a protective layer for preventing the growth is subjected to selective lateral growth. The growing substrate is subsequently removed and, thus, a GaN substrate (nitride semiconductor substrate) having good crystallinity is obtained. Doping of Si, oxygen, or the like during the deposition of the nitride semiconductor layer can allow the conductivity to be adjusted. The resulting GaN substrate by ELOG unevenly includes high-dislocation-density regions and low-dislocation-density regions, depending on deposition conditions and the form of the protective layer. Therefore, in a laser device requiring reliability at a high current density, the waveguide is provided in a low-dislocation-density region to produce superior characteristics. If an insulative substrate, such as sapphire, is used, the p electrode and the n electrode are provided on the same side of the substrate. If a conductive substrate, such as GaN, is used, the p electrode and the n electrode may be provided on the same side, or the n electrode may be provided on the backside of the substrate, not having the functional layers.

Base Layer

An undoped GaN layer is deposited to a thickness of 2.5 µm at a temperature of 1,050° C., and a $SiO_2$ protective layer is formed to a thickness of 0.27 µm. Striped openings (unmasked regions) are formed in the $SiO_2$ protective layer by etching. The stripes of the opening have a width of 1.8 μm and extend perpendicular to orientation that of the substrate. The width ratio of the protective layer to the openings is set at 6:14. Then, undoped GaN is further deposited to a thickness of 15 μm in the openings. The GaN in the openings grows to extend on the $SiO_2$ layer in the lateral direction and ultimately covers the $SiO_2$ layer. The base layer may be formed of AlGaN, InGaN, AlInGAN, or the like, instead of GaN.

Buffer Layer

A Si-doped $Al_{0.02}Ga_{0.98}N$ buffer layer is deposited to a thickness of 1 μm at a temperature of 500° C. using trimethylgallium (TMG) and ammonia ($NH_3$).

N-Type Contact Layer

A n-type contact layer of Si-doped n-$Al_{0.02}Ga_{0.98}N$ is subsequently deposited to a thickness of 3.5 μm at a temperature of 1,050° C. using trimethylgallium (TMG) and ammonia ($NH_3$) as material gases and silane gas as a dopant. The thickness of the resulting n-type contact layer is set in the range of 2 to 30 μm Crack Prevention Layer Then, Si-doped n-$In_{0.05}Ga_{0.95}N$ crack prevention layer is deposited to a thickness of 0.15 μm at a temperature of 800° C. using TMG, $NH_3$, and trimethylindium (TMI). The crack prevention layer may be omitted depending on the type of substrate or the composition of other layers.

N-Type Cladding Layer

An A-layer comprising undoped $Al_{0.05}Ga_{0.095}N$ and subsequently a B-layer comprising Si-doped GaN are deposited to a thickness of 50 Å each at a temperature of 1,050° C. using trimethylaluminum (TMA), TMG, and $NH_3$ as material gases. This sequence of depositions is repeated 110 times to alternately deposit the A-layers and the B-layers to a total thickness of 1.1 μm. Thus, an n-type cladding layer having a layered structure (superstructure) is formed. In order to achieve a difference in refractive index sufficient to function as a cladding layer, the Al crystal ratio in the AlGaN mixed crystal layer may be set in the range of 0.02 to 0.3. Each layer of the cladding layer, having the superstructure may have other crystal ratios or may be formed of InGaN or the like, and any other composition may be selected to be effective in confining light in the active layer. It is not necessary that the n-type cladding layer have a superstructure, and it may be composed of, for example, a single layer of $Al_{0.05}Ga_{0.95}N$.

N-Type Light Guide Layer

An n-type light guide layer of undoped GaN is subsequently deposited to a thickness of 0.15 μm at a similar temperature to the deposition of the cladding layer using TMG and $NH_3$. This layer may be doped with an n-type dopant. The light guide layer may be formed of InGaN, AlGaN, AlInGaN, and the like depending on the composition of the active layer, or may be omitted depending on the composition of the cladding layer.

Active Layer

A Si-doped $In_{0.02}Ga_{0.98}N$ barrier layer is deposited to a thickness of 140 Å at a temperature of 800° C. using TMI, TMG, and $NH_3$ as material gases and silane gas as a dopant. After removing the silane gas, an undoped $In_{0.1}Ga_{0.9}N$ well layer is deposited to a thickness of 70 Å. This sequence of depositions is repeated twice and finally, a Si-doped $In_{0.02}Ga_{0.98}N$ barrier layer is deposited to a thickness of 140 Å. Thus, an active layer with a total thickness of 560 Å having a multi-quantum well (MQW) structure is provided.

The number of the MQW depositions is preferably in the range of about 2 to 30. The MQW structure may be formed of other compositions, such as InGaN/GaN, AlGaN/InGaN, InGaN/AlInGaN, and AlGaN/AlInGaN. A single-quantum well (SQW) structure may also be applied.

P-Type Electron Confinement Layer

A Mg-doped $Al_{0.25}Ga_{0.75}N$ p-type electron confinement layer is subsequently deposited to a thickness of 30 Å at a similar temperature in a $N_2$ atmosphere. The p-type electron confinement layer is further deposited to a thickness of 70 Å in a $H_2$ atmosphere. The p-type electron confinement layer may be of single-layer film deposited at a temperature similar to the deposition temperature of the active layer. The p-type electron confinement layer may be formed of other compositions, such as AlGaN, AlInGaN, and GaN. If the thickness is large, InGaN may be used.

P-Type Light Guide Layer

A p-type light guide layer of undoped GaN is deposited to a thickness of 0.15 μm at a temperature of 1,050° C. using TMG and $NH_3$ as material gases. Although the p-type light guide layer is not doped in Example 1, it may be doped with Mg. The p-type light guide layer may be formed of InGaN, AlGaN, AlInGaN, or the like depending on the composition of the active layer.

P-Type Cladding Layer

An A layer of undoped $Al_{0.08}Ga_{0.92}N$ is deposited to a thickness of 80 Å and a B layer of Mg-doped GaN is deposited to a thickness of 80 Å on the A layer. This sequence of depositions is repeated 28 times to alternately deposit the A layers and the B layers to a total thickness of 0.45 μm. Thus, a p-type cladding layer having a layered structure (superstructure) is provided. If at least one of the A and B layers comprises nitride semiconductor containing Al and the bandgap energies of the two layers are different from each other, the crystallinity of the cladding layer can be enhanced by a so-called modulation dope in which one of the two layers is doped with a larger amount of dopant than the other layer. However, both the A and B layers may be equally doped. Each layer of the cladding layer, having the superstructure may have other crystal ratios or may be formed of InGaN or the like, and any other composition may be selected to be effective in confining light in the active layer. The p-type cladding layer need not to be the superstructure, and may be composed of, for example, a single layer of $Al_{0.05}Ga_{0.95}N$.

P-Type Contact Layer

Finally, a p-type contact layer of Mg-doped GaN is deposited to a thickness of 150 Å on the p-type cladding layer at a temperature of 1,050° C. The p-type contact layer may be formed of a p-type semiconductor expressed by the formula $In_xAl_yGa_{1-x-y}N$ ($x \geq 0$, $y \geq 0$, $x+y \leq 1$), and particularly Mg-doped GaN establishes the best ohmic contact with the p electrode. After the deposition, the resulting composite is annealed to reduce the resistance of the p-type layers at 700° C. in a nitride atmosphere in a reaction chamber.

Exposure of N-Type Contact Layer

The composite of the nitride semiconductor layers taken out from the reaction chamber is provided with a $SiO_2$ protective layer on the surface of the p-type contact layer, being the uppermost layer of the composite, by reactive ion etching (RIE) using $Cl_2$ gas to expose the surface of the n-type contact layer to which an n electrode is formed. At this moment, resonance planes may be formed by etching. Although it is preferable to form the resonance planes simultaneously with the exposure of the n-type contact layer, it may be performed in a different step.

Ridge Stripe

In order to provide a waveguide region in a stripe form, a silicon oxide (primarily $SiO_2$) protective layer is deposited to a thickness of 0.5 μm over substantially the entire surface of the uppermost layer, i.e., p-type contact layer, by chemical vapor deposition (CVD) and is, then, etched to a stripe by RIE using $CHF_3$ gas, through a mask having a predetermined shape formed over the protective layer by photolithography. The p-type contact layer is etched with $SiCl_4$ gas through the silicon oxide protective layer as the mask, thus forming the ridge stripe above the active layer. The resulting ridge stripe has a width of 1.6 μm.

First Insulating Layer

A $ZrO_2$ first insulating layer is formed over the surface of the p-type semiconductor layer, through the $SiO_2$ mask layer remaining. The first insulating layer may be provided over the entire surfaces of the p- and n-type contact layers through a first n electrode-forming region masked. For convenience of cutting, regions having no insulating layer may be provided.

After the formation of the insulating layer, the composite is subjected to heat treatment at 600° C. If the first insulating layer is formed of a material other than $SiO_2$, heat treatment at a temperature of 300° C. or more, preferably 400° C. or more, and lower than or equal to the decomposition temperature (1,200° C.) of the nitride semiconductor layers stabilizes the material of the insulating layer. In particular, if $SiO_2$ is used as a mask for device processing after the formation of the first insulating layer, the heat treatment makes the insulating layer insoluble in a mask solvent used for removing the $SiO_2$ mask. The heat treatment of the first insulating layer may be omitted, depending on the material and production step of the first insulating layer, or may be performed simultaneously with heat treatment of an ohmic electrode. The order of steps may be appropriately varied. After the heat treatment, the composite is immersed in a buffered liquid to dissolve and remove the $SiO_2$ layer on the ridge stripe and, thus, the $ZrO_2$ over the ridge stripe on the p-type contact layer (and the first n electrode-forming region) is removed together with the $SiO_2$ by lift-off. Thus, the upper surface of the ridge stripe is exposed, but the side surfaces are covered with the $ZrO_2$.

First Electrodes (Ohmic Electrodes)

A first p electrode is formed on the surface of the ridge stripe and the first insulating layer by sputtering. The first p electrode comprises a Ni/Au lower layer (100 Å/1,500 Å) and a Pt upper layer (1,500 Å). A first n electrode is formed on the upper surface of the n-type contact layer. The first n electrode is formed of Ti/Al (200 Å/8,000 Å) to a stripe form with the same length as the ridge stripe in parallel with the ridge stripe. These electrodes are subjected to heat treatment at 600° C. in an atmosphere of a mixture of oxygen and nitrogen gases.

Second Insulating Layer

A resist layer is formed to cover the entire surface of the first p electrode on the ridge stripe and part of the upper surface of the first n electrode. Then, $SiO_2$ is deposited over substantially the entire surface of the composite, and is removed by the lift-off method to form a second insulating layer in which the entire upper surface of the first p electrode and part of the first n electrode are exposed. The second insulating layer is separate from the first p electrode in such a manner that the first insulating layer is exposed between them. It is possible that the first and second insulating layers and the electrodes are not provided at striped regions having a width of, for example, about 10 μm between the devices for ease of cutting, performed in a later step.

The second insulating layer is disposed over the entire surface of the composite except the upper surfaces of the first p and n electrodes. Preferably, the second insulating layer is formed of at least one compound selected from the group consisting of SiN, BN, SiC, AlN, AlGaN, and oxides containing at least one element selected from among Si, Ti, V, Zr, Nb, Hf, and Ta. More preferably, the second insulating layer comprises a single-layer or multilayer film of $SiO_2$, $Al_2O_3$, $ZrO_2$, or $TiO_2$.

Second Electrodes (Pad Electrodes)

Second electrodes are formed to cover the first electrodes. Preferably, the second electrodes overlap the second insulating layer. For the second p electrode, Pt is deposited to form a lower layer with a thickness of 1,000 Å, and Ti, Pt, and Au are subsequently deposited, in that order, on the lower layer to the thicknesses of 50 Å, 1,000 Å, and 6,000 Å, respectively. For the second n electrode, Ni, Ti, and Au are deposited to thicknesses of 1,000 Å, 1,000 Å, and 8,000 Å, respectively, in that order. The second p and n electrodes are respectively brought into contact with the first p electrode and the first n electrode in a striped manner with the second insulating layer between the second p and n electrodes.

Cleavage and Formation of Resonator

The resulting composite is ground to a thickness of about 150 μm, and the rear surface of the substrate is subjected to scribing. The composite is cleaved from the side having the nitride semiconductor layers of the substrate to yield a bar-shaped block of lasers. The cleaved surfaces of the nitride semiconductor layers are a nitride semiconductor M plane (1-100) and these surfaces function as resonance planes.

End Surface Protective Layer

Preferably, the resonance planes are each provided with a protective layer on their surfaces so that light efficiently resonates in the active layer. It is preferable to provide a protective layer particularly on the resonance plane on the light-reflecting side (monitor side) of the device from the viewpoint of producing a difference in refractive index between the resonance planes on the light-reflecting side and the light-emitting side. Exemplary materials of the protective layer include conductive elements, such as Si, Mg, Al, Hf, Nb, Zr, Sc, Ta, Ga, Zn, Y, B, and Ti, and their oxides, nitrides, and fluorides. These materials may be used as the sole composite or in combination and the resulting protective layer may comprise a single-layer or multilayer film. Preferred materials contain Si, Mg, Al, Hf, Zr, Y, or Ga. Semiconductive materials of the protective layer include AlN, AlGaN, and BN, and insulative materials include oxides, nitrides, and fluorides of Si, Mg, Al, Hf, Nb, Zr, Sc, Ta, Ga, Zn, Y, and B.

In Example 1, the end surface protective layer of the resonance plane on the light-reflecting side comprises a dielectric multilayer film including $SiO_2$ layers and $ZrO_2$ layers. Specifically, the protective layer includes a $ZrO_2$ protective sublayer formed by sputtering and a high-reflective sublayer formed by depositing six pairs of $SiO_2$ and $ZrO_2$ layers on the $ZrO_2$ protective sublayer. The thicknesses of the protective sublayer and the high-reflective sublayer are each appropriately set accordingly to the wavelength of light from the active layer. The resonance plane on the light-emitting side may be or does not need to be provided with a protective layer including a first low-reflective sublayer of $ZrO_2$, $Nb_2O_5$, or $Al_2O_3$ and a second low-reflective sublayer of $SiO_2$.

Finally, the bar-shaped block of devices is scribed to form grooves substantially parallel to the ridge stripe and is cut along the grooves into chips of the nitride semiconductor laser device of the present invention. The resulting nitride semiconductor laser device can produce continuous oscillation with an emission wavelength of 405 nm, a threshold current density of 2.0 $kA/cm^2$, and a high power of 60 mW at room temperature, without peeling of the electrodes.

Example 2

In Example 2, the second insulating layer overlaps the first p electrode. The laser device of Example 2 is prepared as in Example 1, except that the second insulating layer is formed as follows.

Second Insulating Layer

After the formation of the first electrodes, a $SiO_2$ second insulating layer is formed over substantially the entire surface of the composite. Then, the entire surface over the ridge stripe of the first p electrode, part of the surfaces of the first p electrode at both sides of the ridge stripe, and part of the surface of the first n electrode are exposed by dry etching techniques with a resist. Thus, the side surfaces of the composite and part of the first p and n electrodes are covered with the second insulating layer. Although the first insulating layer is not exposed in Example 2, it may also be exposed.

Second Electrodes (Pad Electrodes)

Second electrodes are formed to overlap the second insulating layer by sputtering. For the second p electrode, Pt is deposited to form a lower layer with a thickness of 1,000 Å, and Ti, Pt, and Au are subsequently deposited, in that order on the lower layer to thicknesses of 50 Å, 1,000 Å, and 6,000 Å, respectively. For the second n electrode, Ni, Ti, and Au are deposited to thicknesses of 1,000 Å, 1,000 Å, and 6000 Å, respectively, in that order. The second p and n electrodes are respectively brought into contact with the first p electrode and the first n electrode in a striped manner with the second insulating layer between the second p and n electrodes. The resulting nitride semiconductor laser device can produce continuous oscillation with an emission wavelength of 405 nm, a threshold current density of 2.0 $kA/cm^2$, and a high power of 60 mW at room temperature, without peeling of the electrodes.

Example 3

In Example 3, an adhesion layer is formed. After forming each layer up to the first insulating layer as described in connection with Example 1, a first p electrode is formed by depositing Ni, Au, and Pt to thicknesses of 100 Å, 1,500 Å, and 1,500 Å, respectively, in that order on the first insulating layer. Then, a second insulating layer is formed of two pairs of $SiO_2$ and $TiO_2$ layers (1,500 Å/1,000 Å). In this instance, the second insulating layer is disposed at a distance of about 225 μm from the first p electrode. A Ti/Pt adhesion layer (100 Å/500 Å) is formed from the upper surface of a part of the first p electrode to the upper surface of the second insulating layer through the exposed portion of the first insulating layer between the first p electrode and the second insulating layer. Then, a Pt/Ti/Pt/Au second p electrode (1,000 Å/50 Å/1,000 Å/6,000 Å) is formed from the upper surface of the first p electrode to the upper surface of the adhesion layer. Other steps are performed as in Example 1, and thus a nitride semiconductor laser device is prepared. The resulting nitride semiconductor laser device can produce continuous oscillation with an emission wavelength of 405 nm, a threshold current density of 2.0 $kA/cm^2$, and a high power of 60 mW at room temperature, without peeling of the electrodes.

Example 4

A nitride semiconductor laser device is prepared as described in connection with Example 1, except for the formation of the first p electrode and the second p electrode. In Example 4, the first p electrode comprises a Ni/Au lower layer (100 Å/1,500 Å) and a Pt/Ti/Pt upper layer (500 Å/100 Å/500 Å), and the second p electrode comprises a Pt lower layer (1,000 Å) and a Ti/Pt/Au upper layer (100 Å/1,000 Å/6,000 Å). The resulting nitride semiconductor laser device can produce continuous oscillation with an emission wavelength of 405 nm, a threshold current density of 2.0 $kA/cm^2$, and a high power of 60 mW at room temperature.

In the present invention, a joint region is provided between a first electrode, which establishes an ohmic contact with a semiconductor layer by heat treatment, and a second electrode for extraction to produce superior adhesion. Thus, the resulting nitride semiconductor device has extremely stable and reliable operating characteristics, exhibiting, for example, low operating voltage and less aging even in high-power operation. Furthermore, an adhesion layer between an electrode and an insulating layer provides a wide variety of choices in electrode material and insulating layer material, consequently providing a nitride semiconductor device exhibiting superior operating voltage and good adhesion.

What is claimed is:

1. A nitride semiconductor device comprising:
   a semiconductor layer;
   an insulating layer being disposed on a portion of a surface of the semiconductor layer;
   a first electrode for establishing an ohmic contact and being disposed on another portion of the semiconductor layer;
   an adhesion layer being disposed on at least a portion of the first electrode; and
   a second electrode having a different shape from a shape of the first electrode;
   wherein at least a portion of the insulating layer is disposed between the first electrode and the semiconductor layer; and
   wherein the surface of the semiconductor layer on which the first electrode is disposed comprises an electrode formation region and an insulating layer formation region, wherein the first electrode further includes an upper layer and a lower layer, and the second electrode further includes an upper layer and a lower layer, wherein the upper layer of the first electrode and the lower layer of the second electrode each comprises an elemental metal, a compound or alloy including one of Pt, Pd, Rh, Ir, Ru, and Os.

2. The nitride semiconductor device according to claim 1, wherein the adhesion layer comprises a single-layer film.

3. The nitride semiconductor device according to claim 1, wherein the adhesion layer comprises a multilayer film.

4. The nitride semiconductor device according to claim 1, wherein the upper layer of the first electrode comprises an elemental metal selected from the group consisting of Pt, Pd, Rh, Ir, Ru, and Os.

5. The nitride semiconductor device according to claim 1, wherein the lower layer of the second electrode comprises an elemental metal selected from the group consisting of Pt, Pd, Rh, Ir, Ru, and Os.

6. The nitride semiconductor device according to claim 1, wherein the upper layer of the first electrode and the lower layer of the second electrode each comprises an elemental metal selected from the group consisting of Pt, Pd, Rh, Ir, Ru, and Os.

7. The nitride semiconductor device according to claim 1, wherein the adhesion layer comprises a conductive material.

8. The nitride semiconductor device according to claim 1, wherein the adhesion layer enhances adhesion between the insulating layer and the second electrode.

9. The nitride semiconductor device according to claim 1, wherein the adhesion layer enhances adhesion between the first electrode and the second electrode.

10. The nitride semiconductor device according to claim 1, wherein the adhesion layer enhances adhesion between the insulating layer and the first and second electrodes.

11. The nitride semiconductor device according to claim 1, wherein the adhesion layer and the second electrode each include at least one side surface that is coplanar.

12. The nitride semiconductor device according to claim 11, wherein the adhesion layer and the second electrode each include at least two side surfaces that are coplanar.

13. The nitride semiconductor device according to claim 1, wherein the insulating layer further includes a first insulating sublayer and a second insulating sublayer.

14. The nitride semiconductor device according to claim 1, wherein the second electrode is disposed on said adhesion layer.

15. A nitride semiconductor device comprising:
a semiconductor layer;
an insulating layer being disposed on a portion of a surface of the semiconductor layer;
a first electrode for establishing an ohmic contact and being disposed on another portion of the semiconductor layer;
an adhesion layer being disposed on at least a portion of the first electrode; and
a second electrode having a different shape from a shape of the first electrode;
wherein at least a portion of the insulating layer is disposed between the first electrode and the semiconductor layer;
wherein the surface of the semiconductor layer on which the first electrode is disposed comprises an electrode formation region and an insulating layer formation region, wherein the first electrode further includes an upper layer and a lower layer, and the second electrode further includes an upper layer and a lower layer, wherein the upper layer of the first electrode and the lower layer of the second electrode each comprises an elemental metal, a compound or alloy including one of Pt, Pd, Rh, Ir, Ru, and Os, and
wherein the adhesion layer is disposed between the first electrode and the second electrode.

16. The nitride semiconductor device according to claim 15, wherein the adhesion layer comprises a single-layer film.

17. The nitride semiconductor device according to claim 15, wherein the adhesion layer comprises a multilayer film.

18. The nitride semiconductor device according to claim 15, wherein the upper layer of the first electrode comprises an elemental metal selected from the group consisting of Pt, Pd, Rh, Ir, Ru, and Os.

19. The nitride semiconductor device according to claim 15, wherein the lower layer of the second electrode comprises an elemental metal selected from the group consisting of Pt, Pd, Rh, Ir, Ru, and Os.

20. The nitride semiconductor device according to claim 15, wherein the upper layer of the first electrode and the lower layer of the second electrode each comprises an elemental metal selected from the group consisting of Pt, Pd, Rh, Ir, Ru, and Os.

21. The nitride semiconductor device according to claim 15, wherein the adhesion layer comprises a conductive material.

22. The nitride semiconductor device according to claim 15, wherein the adhesion layer enhances adhesion between the insulating layer and the second electrode.

23. The nitride semiconductor device according to claim 15, wherein the adhesion layer enhances adhesion between the first electrode and the second electrode.

24. The nitride semiconductor device according to claim 15, wherein the adhesion layer enhances an adhesion between the insulating layer and the first and second electrodes.

25. The nitride semiconductor device according to claim 15, wherein the adhesion layer and the second electrode each include at least one side surface that is coplanar.

26. The nitride semiconductor device according to claim 25, wherein the adhesion layer and the second electrode each include at least two side surfaces that are coplanar.

27. The nitride semiconductor device according to claim 15, wherein the insulating layer further includes a first insulating sublayer and a second insulating sublayer.

28. The nitride semiconductor device according to claim 15, wherein the second electrode is disposed on said adhesion layer.

29. A nitride semiconductor device comprising:
a semiconductor layer;
an insulating layer being disposed on a first portion of a surface of the semiconductor layer;
a first electrode for establishing an ohmic contact and being disposed on a second portion of the surface of the semiconductor layer;
a second electrode having a different shape from a shape of the first electrode;
an adhesion layer being disposed so that at least a portion of the adhesion layer is in contact with the second electrode;
wherein at least a portion of the insulating layer is disposed between the first electrode and the semiconductor layer; and
wherein the surface of the semiconductor layer on which the first electrode is disposed comprises an electrode formation region and an insulating layer formation region, wherein the first electrode further includes an upper layer and a lower layer, and the second electrode further includes an upper layer and a lower layer, wherein the upper layer of the first electrode and the lower layer of the second electrode each comprises an elemental metal, a compound or alloy including one of Pt, Pd, Rh, Ir, Ru, and Os.

30. The nitride semiconductor device according to claim 29, wherein the first portion and the second portion of the semiconductor layer overlap each other.

31. The nitride semiconductor device according to claim 29, wherein the adhesion layer enhances adhesion between the insulating layer and the second electrode.

32. The nitride semiconductor device according to claim 29, wherein the adhesion layer enhances adhesion between the first electrode and the second electrode.

33. The nitride semiconductor device according to claim 29, wherein the adhesion layer enhances adhesion between the insulating layer and the first and second electrodes.

34. The nitride semiconductor device according to claim 1, wherein at least a portion of the insulating layer is disposed between the lower layer of the first electrode and the semiconductor layer so that the lower layer of the first electrode is spaced apart from the semiconductor layer.

35. The nitride semiconductor device according to claim 15, wherein at least a portion of the insulating layer is disposed between the lower layer of the first electrode and the semiconductor layer so that the lower layer of the first electrode is spaced apart from the semiconductor layer.

36. The nitride semiconductor device according to claim 29, wherein at least a portion of the insulating layer is disposed between the lower layer of the first electrode and the semiconductor layer so that the lower layer of the first electrode is spaced apart from the semiconductor layer.

* * * * *